(12) United States Patent
Kim et al.

(10) Patent No.: US 11,694,930 B2
(45) Date of Patent: Jul. 4, 2023

(54) SEMICONDUCTOR DEVICE HAVING BURIED GATE STRUCTURE AND METHOD FOR FABRICATING THE SAME

(71) Applicant: SK hynix Inc., Gyeonggi-do (KR)

(72) Inventors: Dong-Soo Kim, Gyeonggi-do (KR); Se-Han Kwon, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/561,300

(22) Filed: Dec. 23, 2021

(65) Prior Publication Data

US 2022/0122888 A1 Apr. 21, 2022

Related U.S. Application Data

(63) Continuation of application No. 16/852,614, filed on Apr. 20, 2020, now Pat. No. 11,239,118.

(30) Foreign Application Priority Data

Sep. 17, 2019 (KR) .................. 10-2019-0114010

(51) Int. Cl.
*H01L 21/8234* (2006.01)
*H01L 29/423* (2006.01)
*H01L 29/417* (2006.01)
*H01L 21/768* (2006.01)
*H10B 12/00* (2023.01)

(52) U.S. Cl.
CPC ........... *H01L 21/823418* (2013.01); *H01L 21/76877* (2013.01); *H01L 21/823468* (2013.01); *H01L 29/41783* (2013.01); *H01L 29/4236* (2013.01); *H10B 12/053* (2023.02); *H10B 12/34* (2023.02)

(58) Field of Classification Search
None
See application file for complete search history.

(56) References Cited

U.S. PATENT DOCUMENTS

2014/0061781 A1* 3/2014 Kim ................ H01L 21/283 257/331
2015/0228751 A1* 8/2015 Kim ................ H01L 29/66666 438/586

* cited by examiner

Primary Examiner — Hsien Ming Lee
(74) Attorney, Agent, or Firm — IP & T Group LLP

(57) ABSTRACT

A method for fabricating a semiconductor device includes forming a trench in a substrate, forming a gate dielectric layer on a surface of the trench, forming a lower gate, which partially fills the trench, over the gate dielectric layer, forming a low work function layer over the lower gate, forming a spacer over the low work function layer, etching the low work function layer to be self-aligned with the spacer in order to form vertical gate on both upper edges of the lower gate, and forming an upper gate over the lower gate between inner sidewalls of the vertical gate.

7 Claims, 25 Drawing Sheets

SEMICONDUCTOR DEVICE HAVING BURIED GATE STRUCTURE AND METHOD FOR FABRICATING THE SAME

CROSS-REFERENCE TO RELATED APPLICATIONS

This application is a continuation of U.S. patent application Ser. No. 16/852,614 filed on Apr. 20, 2020, which issued as U.S. Pat. No. 11,239,118 and claims the benefits of priority of Korean Patent Application No. 10-2019-0114010 filed on Sep. 17, 2019. The disclosures of each of the foregoing applications are incorporated herein by reference in its entirety.

BACKGROUND

1. Field

Various embodiments relate generally to a semiconductor device, and particularly, to a semiconductor device having a buried gate structure and a method for fabricating the same.

2. Description of the Related Art

A metal gate electrode is applied for high performance of a transistor. Particularly, a buried gate type transistor requires control of a threshold voltage for a high-performance operation. In addition, gate induced drain leakage (GIDL) characteristics greatly affect the performance of the buried gate type transistor.

SUMMARY

Various embodiments of the present invention are directed to a semiconductor device that may improve a gate induced drain leakage (GIDL), and a method for fabricating the semiconductor device.

In accordance with an embodiment, a method for fabricating a semiconductor device may include: forming a trench in a substrate; forming a gate dielectric layer over a surface of the trench; forming a lower gate, which partially fills the trench, over the gate dielectric layer; forming a low work function layer over the lower gate; forming a spacer over the low work function layer; etching the low work function layer to be self-aligned with the spacer, in order to form vertical gate on both upper edges of the lower gate; and forming an upper gate over the lower gate between inner sidewalls of the vertical gate.

In accordance with an embodiment, a semiconductor device may include: a gate dielectric layer conformally covering the trench of a substrate; a lower gate formed over the gate dielectric layer and partially filling a lower portion of the trench; a vertical gate formed on both upper edges of the lower gate; an upper gate filled in inner space of the vertical gate; a capping layer formed over the upper gate; and a spacer formed between the gate dielectric layer and the capping layer.

DETAILED DESCRIPTION

Figure 1:
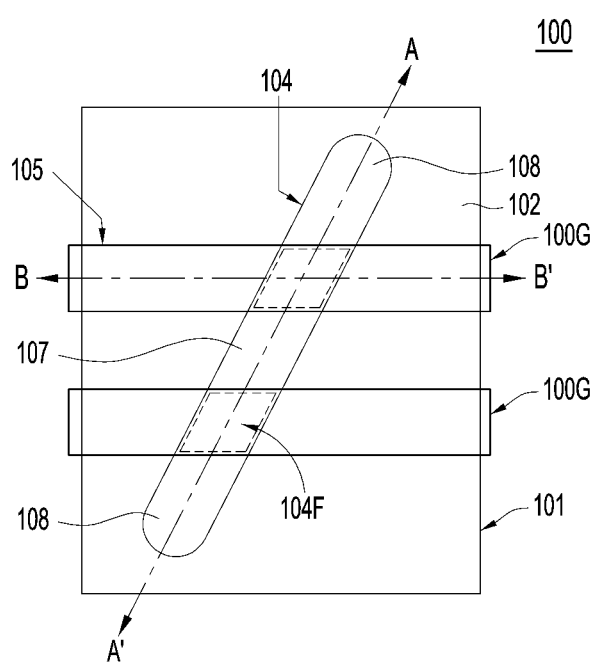
FIG. 1 is a plane view illustrating a semiconductor device in accordance with an embodiment of the present invention.

Various embodiments described herein may be described with reference to cross-sectional views, plane views and block diagrams, which are ideal schematic views of the semiconductor device according to specific embodiments of the present invention. It is noted that the structures of the drawings may be modified by fabricating techniques and/or tolerances. The present invention is not limited to the described embodiments and the specific structures shown in the drawings, but may include other embodiments, or modifications of the described embodiments including any changes in the structures that may be produced according to requirements of the fabricating process. Accordingly, the regions illustrated in the drawings have schematic attributes, and the shapes of the regions illustrated in the drawings are intended to illustrate specific structures of regions of the elements, and are not intended to limit the scope of the invention.

Hereinafter, in the present embodiments, a threshold voltage Vt may depend on a flat-band voltage VFB, and the flat-band voltage VFB may depend on a work function. The work function may be adjusted by various methods. For example, the work function may be adjusted by the material employed for the gate electrode, or by the material employed between the gate electrode and the channel of a memory cell. Adjusting the work function may cause the flat-band voltage to shift. Generally, a high work function may shift the flat-band voltage in a positive direction, and a low work function may shift the flat-band voltage in a negative direction. This way, the threshold voltage may be adjusted by shifting the flat-band voltage. In various embodiments, the threshold voltage may be adjusted by shifting the flat-band voltage even when the channel doping concentration is reduced or channel doping is omitted. In particular, the flat-band voltage may be lowered by employing a material having a low work function, thereby improving a gate induced drain leakage (GIDL).

Hereinafter, in various embodiments of the semiconductor device, a buried gate structure may be located in a trench. The buried gate structure may include a stack of a gate dielectric layer, a gate electrode and a capping layer. The gate dielectric layer may cover a surface of the trench, and the gate electrode may be formed on the gate dielectric layer. The gate electrode may be in direct contact with the gate dielectric layer. The gate electrode may partially fill the trench, and the capping layer may fill a remaining portion of the trench not covered by the gate electrode. The gate electrode may be referred to as a "buried gate electrode".

The gate electrode according to the present invention may be a dual gate electrode. Unlike a single gate electrode which is typically formed of a single material of polysilicon or a metal the dual gate may include a bilayer stack of different gate electrodes. The dual gate electrode may include a same metal dual gate formed of a stack of two layers made of the same metal, a different metal dual gate formed of a stack of two layers made of different metals or a different material dual gate formed of a stack of one layer made of a metal and one layer made of polysilicon.

The dual gate may include an upper gate, and a lower gate. The lower gate may include a barrier layer and a low resistivity material, the barrier layer separating the low resistivity material from the gate dielectric layer lining the trench in which the gate electrode is formed. The barrier layer may serve to block an impurity diffused from the low resistivity material to the gate dielectric layer or to prevent inter-diffusion and reaction between these two different materials. The low resistivity material may serve to decrease sheet resistance of the gate electrode.

The gate electrode may include a material having an engineered work function. The engineering of the work function may refer to a material or method that may adjust the work function to have a reduced work function, i.e., a low work function, or an increased work function, i.e., a high work function.

The lower gate may fill a lower portion of the trench, and the upper gate may fill a middle portion of the trench. The upper gate may be formed on the lower gate and be in direct contact with the lower gate. The gate electrode may be referred to as a dual gate in which the upper gate is located on the lower gate. The lower gate may vertically and laterally overlap with a channel. The upper gate may laterally overlap with first and second doped regions, i.e., source and drain regions. The overlapping of the upper gate with the first and second doped regions may be only partial, meaning that the upper gate and the first and second doped regions are not coextensive in the vertical direction.

Figure 2A:
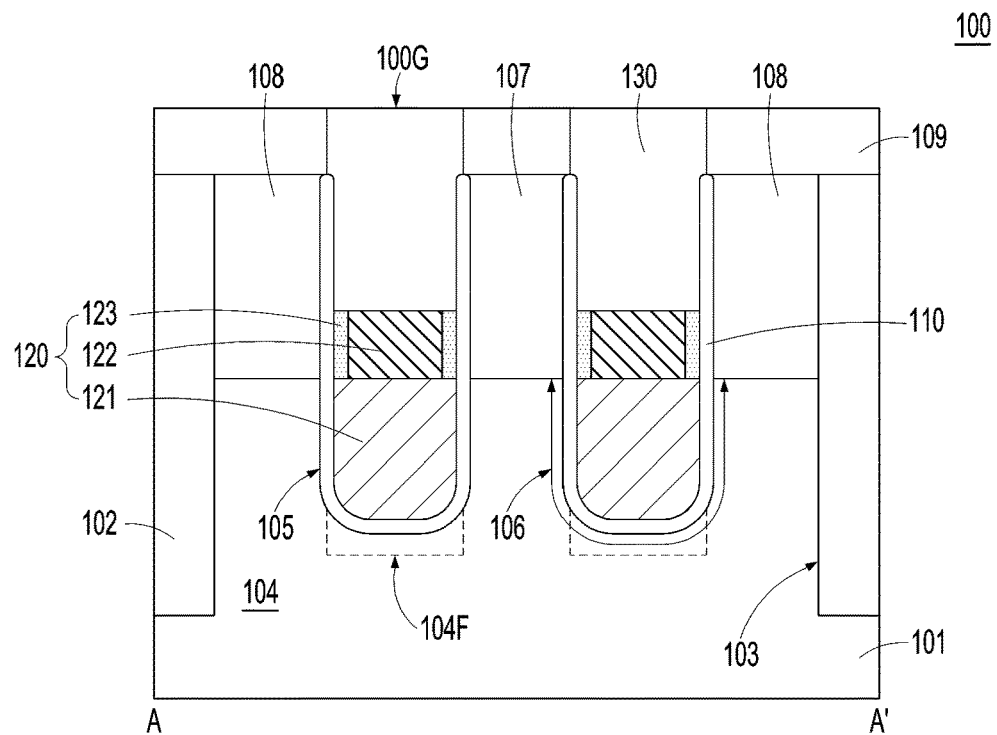
FIG. 2A is a cross-sectional view illustrating the semiconductor device taken along an A-A' line illustrated in FIG. 1.
Figure 2B:
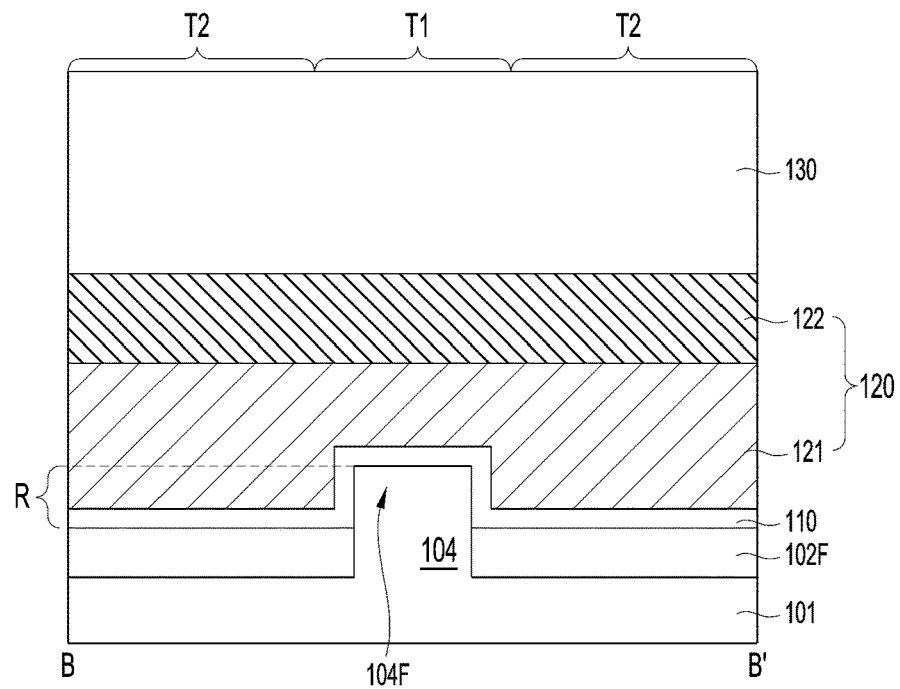
FIG. 2B is a cross-sectional view illustrating the semiconductor device taken along a B-B' line illustrated in FIG. 1.

FIG. 1 is a plane view illustrating a semiconductor device 100 in accordance with an embodiment of the present invention. FIG. 2A is a cross-sectional view illustrating the semiconductor device 100 taken along an A-A' line illustrated in FIG. 1. FIG. 2B is a cross-sectional view illustrating the semiconductor device 100 taken along a B-B' line illustrated in FIG. 1.

Referring to FIGS. 1, 2A and 2B, the semiconductor device 100 may include a substrate 101 and a buried gate structure 100G embedded in the substrate 101. The semiconductor device 100 may be a part of a memory cell. For example, the semiconductor device 100 may be a part of a memory cell of a DRAM.

The substrate 101 may be a material suitable for semiconductor processing. The substrate 101 may include a semiconductor substrate. The substrate 101 may be formed of a silicon-containing material. The substrate 101 may include silicon, monocrystalline silicon, polysilicon, amorphous silicon, silicon germanium, monocrystalline silicon germanium, polycrystalline silicon germanium, carbon-doped silicon, combinations thereof or multi-layers thereof. The substrate 101 may include another semiconductor material, such as germanium. The substrate 101 may include an III/V-group semiconductor substrate, for example, a chemical compound semiconductor substrate such as gallium arsenide (GaAs). The substrate 101 may include a Silicon-On-Insulator (SOI) substrate.

An isolation layer 102 and an active region 104 may be formed in the substrate 101. The active region 104 may be defined by the isolation layer 102. The isolation layer 102 may be a Shallow Trench Isolation (STI) region formed by trench etching. The isolation layer 102 may be formed by filling a shallow trench, for example, an isolation trench 103, with a dielectric material. The isolation layer 102 may be made of or include silicon oxide, silicon nitride or a combination thereof.

Trench 105 may be formed in the substrate 101. Referring to FIG. 1, the trench 105 may have a line shape extended in any one direction. The trench 105 may have a line shape crossing the active region 104 and the isolation layer 102. The trench 105 may have a shallower depth than the isolation trench 103. The trench 105 is a space in which the buried gate structure 100G is formed and may also be referred to as a "gate trench". In an embodiment, the trench 105 may have a bottom portion (also referred to herein as a bottom surface) which has a curvature and an upper portion which includes opposite, first and second sidewalls. The sidewalls of the trench 105 may be slightly curved at an edge portion thereof connecting with the bottom portion of the trench 105. The sidewalls of the trench 105 may be vertical or substantially vertical to the top surface of the substrate. In some other embodiments, the trench 105 may have a bottom portion (also referred to herein as a bottom surface) which is substantially flat and parallel to a top surface of the substrate 101. The edges of the bottom portion of the trench 105 may be curved to provide a smooth, transition between the vertical sidewalls and the flat bottom portion. The sidewalls of the trench may be slightly curved at an edge portion thereof connecting with the bottom portion of the trench 105.

First and second doped regions 107, 108 may be formed in the active region 104. The first and second doped regions 107 and 108 may be doped with conductive dopants. For example, the conductive dopants may include phosphorus (P), arsenic (As), antimony (Sb) or boron (B). The first and second doped regions 107 and 108 may be doped with the same conductive dopant. The first and second doped regions 107 and 108 may be located in the active region 104 on both sides of the trench 105. The bottom surfaces of the first and second doped regions 107 and 108 may be located at a predetermined depth from the top surface of the active region 104. The first and second doped regions 107 and 108 may contact the sidewalls of the trench 105. The bottom surfaces of the first and second doped regions 107 and 108 may be higher than the bottom surface of the trench 105. The first doped region 107 may be referred to as a "first source/drain region", and the second doped region 108 may be referred to as a "second source/drain region". A channel 106 may be defined between the first doped region 107 and the second doped region 108 by the buried gate structure 100G. The channel 106 may be defined along the profile of the trench 105.

The trench 105 may include a first trench T1 and a second trench T2. The first trench T1 may be formed in the active region 104. The second trench T2 may be formed in the isolation layer 102. The trench 105 may have a shape that is continuously extended from the first trench T1 to the second trench T2. In the trench 105, the bottom surfaces of the first and second trenches T1 and T2 may be located at different levels. For example, the bottom surface of the first trench T1 may be located at a higher level than the bottom surface of the second trench T2. A difference in height between the first trench T1 and the second trench T2 may be formed as the isolation layer 102 is recessed. Thus, the second trench T2 may include a recessed region R having a bottom surface that is lower than the bottom surface of the first trench T1. A fin region 104F may be formed in the active region 104 due to the step change in depth between the first trench T1 and the second trench T2. Thus, the active region 104 may include the fin region 104F.

As such, the fin region 104F may be formed below the first trench T1, and the sidewalls of the fin region 104F are exposed by a recessed isolation layer 102F. The fin region 104F is a region in which a part of the channel CH may be formed. The fin region 104F is also called a "saddle fin". The fin region 104F may increase the channel width and improve the electrical characteristics.

In an embodiment, the fin region 104F may be omitted.

The buried gate structure 100G may include gate dielectric layer 110 covering the bottom surface and sidewalls of the trench 105. The buried gate structure 100G may further include a gate electrode 120 and capping layer 130 which are sequentially stacked along the vertical direction inside the trench to fill the trench 105. The gate electrode 120 and the capping layer 130 may be formed directly on the gate dielectric layer 110. The gate electrode 120 may be made of or include a lower gate 121, an upper gate 122 and vertical gate 123. The lower gate 121 may fill the lower portion of the trench 105 on the gate dielectric layer 110. The upper gate 122 and the vertical gate 123 may be formed directly on the lower gate 121 to fill a middle portion of the trench 105. The vertical gate 123 may be formed on both upper edges of the lower gate 121 and in direct contact with a portion of the gate dielectric layer 110 covering the sidewalls of the trench 105. The upper gate 122 may be formed to fill the space formed between the inner sidewalls of the vertical gate 123. The outer sidewalls of the vertical gate 123 are in direct contact with respective portions of the gate dielectric layer 110 covering the sidewalls of the trench 105. The capping layer 130 may fill the upper portion of the trench 105 covering the upper gate 122 and the vertical gate 123. The lower, middle and upper portions of the trench 105 are for convenience in description, and the heights or depths thereof may be the same or different. In top view, the ends of the vertical gate 123 may be connected to each other, and surrounding the sidewalls of the upper gate 122.

The gate dielectric layer 110 may be made of or include silicon oxide, silicon nitride, silicon oxynitride, a high-k material or combinations thereof. The high-k material may be or include a material having a higher dielectric constant than silicon oxide. For example, the high-k material may be or include any suitable material having a higher dielectric constant than 3.9. In an embodiment, the high-k material may be or include any suitable material having a higher dielectric constant than 10. In an embodiment, the high-k material may be or include any suitable material having a dielectric constant ranging from 10 to 30. The high-k material may be or include at least one metallic element. The high-k material may be or include a hafnium-containing material. The hafnium-containing material may be or include hafnium oxide, hafnium silicon oxide, hafnium silicon oxynitride or combinations thereof. In an embodiment, the high-k material may be or include lanthanum oxide, lanthanum aluminum oxide, zirconium oxide, zirconium silicon oxide, zirconium silicon oxynitride, aluminum oxide or combinations thereof. As the high-k material, other publicly-known high-k materials may also be selectively used. The gate dielectric layer 110 may be or include metal oxide.

The gate electrode 120 may be located inside the trench 105 so that a top layer of the gate electrode 120 may be at a lower level than the top surface of the active region 104. The lower gate 121 may have a shape of filling the lower portion of the trench 105. The lower gate 121 may be or include a low resistivity material in order to decrease gate sheet resistance. The lower gate 121 may be or include a metal-based material. The lower gate 121 may be or include a metal, metal nitride or a combination thereof. The lower gate 121 may be or include tantalum nitride (TaN), titanium nitride (TiN), tungsten (W), tungsten nitride (WN) or combinations thereof. In an embodiment, the lower gate 121 may be formed of titanium nitride only. In another embodiment, the lower gate 121 may be formed of a stack of titanium nitride (TiN) and tungsten (W), simply denoted as a TiN/W stack.

In an embodiment, the lower gate 121 may have a high work function, i.e., a work function that is higher than the mid-gap work function of silicon. A low work function refers to a work function that is lower than the mid-gap work function of silicon. Specifically, the high work function may be higher than 4.5 eV, and the low work function may be lower than 4.5 eV. The lower gate 121 may be made of or include P-type polysilicon or nitrogen-rich titanium nitride (TiN).

In an embodiment, the lower gate 121 may have an increased high work function. The lower gate 121 may be made of or include metal silicon nitride. The metal silicon nitride may be metal nitride doped with silicon. The lower gate 121 may be made of or include metal silicon nitride having an adjusted atomic percent of silicon. For example, the lower gate 121 may be made of or include tantalum silicon nitride (TaSiN) or titanium silicon nitride (TiSiN). Titanium nitride may have a high work function, and contain silicon to further increase the work function thereof. Titanium silicon nitride may have an adjusted atomic percent of silicon, so as to have an increased high work function. In order to have the increased high work function, the atomic percent (at %) of silicon in the titanium silicon nitride may be equal to or less than 21 at %. As a comparative example, in order to have a low work function, the atomic percent (at %) of silicon in the titanium silicon nitride may be equal to or more than 30 at %.

The upper gate 122 may be formed directly on the lower gate 121 to fill the space of the middle portion of the trench 105 defined by the vertical gate 123. Hence, the upper gate 122 may have a shape of partially filling the middle portion of the trench 105. The top surface of the upper gate 122 may be located at a lower level than the top surface of the active region 104. The upper and lower gates 122 and 121 may be made of the same material or different materials. In an embodiment, the upper and lower gates 122 and 121 may be made of the same material. In another embodiment the upper and lower gates 122 and 121 may be made of different materials.

The upper gate 122 may be made of a low resistivity material to decrease the gate sheet resistance. The upper gate 122 may be made of or include a metal-based material. The upper gate 122 may be made of or include a metal, metal nitride or a combination thereof. The upper gate 122 may be made of or include tantalum nitride (TaN), titanium nitride (TiN), tungsten (W), tungsten nitride (WN) or combinations thereof. In an embodiment, the upper gate 122 may be formed of titanium nitride only. In another embodiment, the upper gate 122 may be formed of a stack of titanium nitride (TiN) and tungsten (W), i.e., a TiN/W stack. In an embodiment, each of the lower and upper gates 121 and 122 may be formed of titanium nitride only. In another embodiment, each of the lower and upper gates 121 and 122 may be formed of a stack of titanium nitride (TiN) and tungsten (W), i.e., TiN/W. The upper gate 122 may have a smaller height than the lower gate 121, and thus the volume of the trench 105 occupied by the lower gate 121 may be larger. The upper gate 122 may be formed to have a smaller width than the lower gate 121 with the vertical gate 123 filling the space between the gate dielectric layer 110 and the sidewalls of the upper gate 122. Thus, the upper gate 122 may not contact directly the gate dielectric layer 110.

The vertical gate 123 may cover both sidewalls of the upper gate 122. The vertical gate 123 may be located between the upper gate 122 and the gate dielectric layer 110. The vertical gate 123 may be extended vertically from both upper edge surfaces of the lower gate 121. The vertical gate 123 may have a lower work function than the lower gate 121. The vertical gate 123 may be made of or include a low work function metal or N-type polysilicon.

In the present embodiment, the lower and upper gates 121 and 122 may be made of or include low resistivity metal-based materials, and the vertical gate 123 may be made of or include a low work function material.

The capping layer 130 may serve to protect the upper gate 122 and the vertical gate 123. The capping layer 130 may fill the upper portion of the trench 105 and may be formed directly on the upper gate 122 and the vertical gate 123. The top surface of the capping layer 130 may be located at the same level as the top surfaces of the first and second doped regions 107 and 108. The capping layer 130 may be made of or include a dielectric material. The capping layer 130 may be made of or include silicon nitride, silicon oxynitride or a combination thereof. In an embodiment, the capping layer 130 may be made of or include a combination of silicon nitride and silicon oxide. The capping layer 130 may be made of or include a silicon nitride liner and a Spin-On-Dielectric (SOD) material.

A hard mask layer 109 may be formed on both sides of the capping layer 130. The hard mask layer 109 may be formed directly on both sides of the capping layer 130. The hard mask layer 109 may be made of or include a dielectric material. The hard mask layer 109 may be formed on the substrate 101, and cover the active region 104 and the isolation layer 102. The hard mask layer 109 may be in direct contact with the active region 104 and the isolation layer 102.

As described above, the gate electrode 120 may include the lower gate 121, the upper gate 122 and the vertical gate 123. This structure may be advantageous because the gate induced drain leakage (GIDL) may be improved significantly by the vertical gate 123.

FIGS. 3A to 3K are cross-sectional views illustrating an example of a method for forming a semiconductor device in accordance with an embodiment of the present invention. FIGS. 3A to 3K illustrate an example of a method for forming the semiconductor device 100 of FIG. 2A.

Figure 3A:
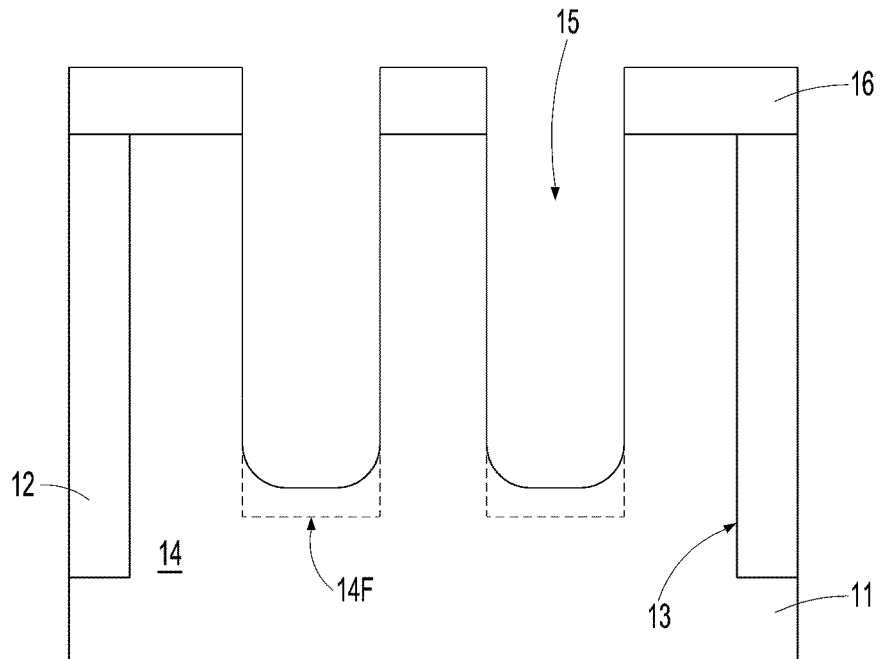
FIGS. 3A to 3K are cross-sectional views illustrating an example of a method for forming a semiconductor device in accordance with an embodiment of the present invention.

As illustrated in FIG. 3A, an isolation layer 12 may be formed in a substrate 11 to define an active region 14. The isolation layer 12 may be formed using a shallow trench isolation (STI) process. For example, an isolation trench 13 may be formed by etching the substrate 11, and filled with a dielectric material to form the isolation layer 12. The isolation layer 12 may be made of or include silicon oxide, silicon nitride or a combination thereof. The isolation trench 13 may be filled with a dielectric material using a deposition process such as, for example, a chemical vapor deposition (CVD) process. Also, a planarization process such as chemical-mechanical polishing (CMP) may be additionally used to remove any excess of the deposited material above the isolation trench 13.

A trench 15 may be formed in the substrate 11. The trench 15 may have a line shape crossing the active region 14 and the isolation layer 12. The trench 15 may be formed by etching the substrate 11 using hard mask layer 16 as an etch mask. The hard mask layer 16 may be formed on the substrate 11 and the isolation layer 12 and may have a line-shaped opening. The hard mask layer 16 may be formed of a material having an etch selectivity with respect to the material of the substrate 11. For example, the hard mask layer 16 may be a silicon oxide, such as Tetra-Ethyl-Ortho-Silicate (TEOS). The trench 15 may be formed to be shallower than the isolation trench 13. The trench 15 may be sufficiently deep and wide to allow forming a sufficiently large gate electrode having a large average cross-sectional area, which is to be formed subsequently. In this way, the resistance of the gate electrode may be decreased. In an embodiment, the bottom edges of the trench 15 may have a curvature.

Subsequently, a fin region 14F may be formed. The fin region 14F may be formed by selectively recessing the isolation layer 12 below the trench 15. For the structure of the fin region 14F, the reference is made to the fin region 104F of FIG. 2B.

Figure 3B:
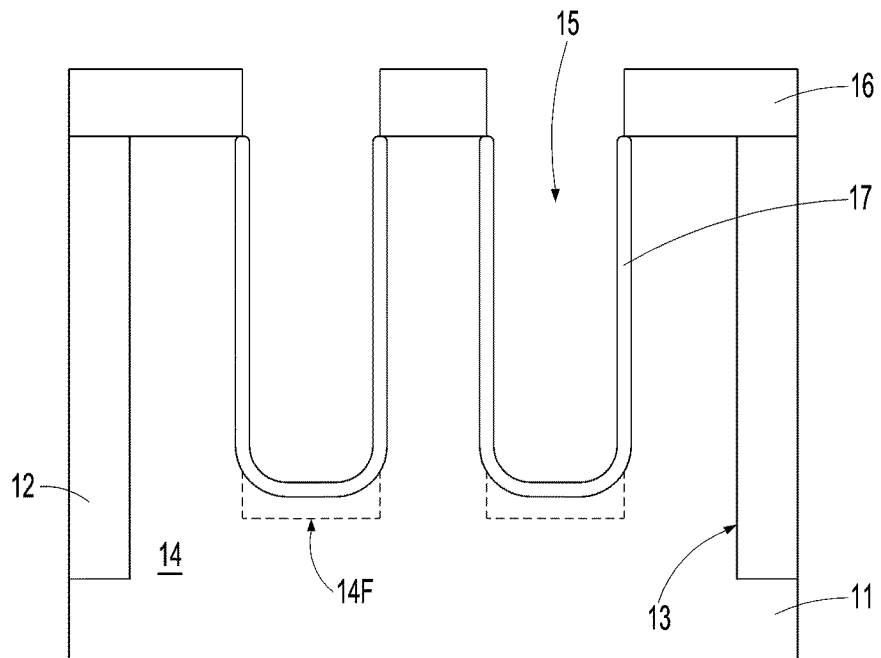

As illustrated in FIG. 3B, a gate dielectric layer 17 may be formed directly on the surface of the trench 15 to cover the entire surface (bottom and sidewalls) of the trench 15. Before the gate dielectric layer 17 is formed, the surface of the trench 15 that is damaged from the etch process may be recovered. For example, sacrificial oxide may be formed by a thermal oxidation treatment, and then the sacrificial oxide may be removed. The gate dielectric layer 17 may be formed by a thermal oxidation process. The gate dielectric layer 17 may be made of or include silicon oxide. In an embodiment, the gate dielectric layer 17 may be formed by a deposition process, such as a chemical vapor deposition (CVD) process or an atomic layer deposition (ALD) process. The gate dielectric layer 17, which is formed by the deposition process, may be made of or include a high-k material, oxide, nitride, oxynitride or combinations thereof. The high-k material may be or include a hafnium-containing material. The hafnium-containing material may be or include hafnium oxide, hafnium silicon oxide, hafnium silicon oxynitride or combinations thereof. In an embodiment, the high-k material may be or include lanthanum oxide, lanthanum aluminum oxide, zirconium oxide, zirconium silicon oxide, zirconium silicon oxynitride, aluminum oxide or combinations thereof. As the high-k material, other publicly-known high-k materials may also be selectively used. The gate dielectric layer 17 may include a stack of silicon oxide and a high-k material, and the high-k material may be or include a material having a higher areal density of oxygen atoms than the silicon oxide.

Figure 3C:
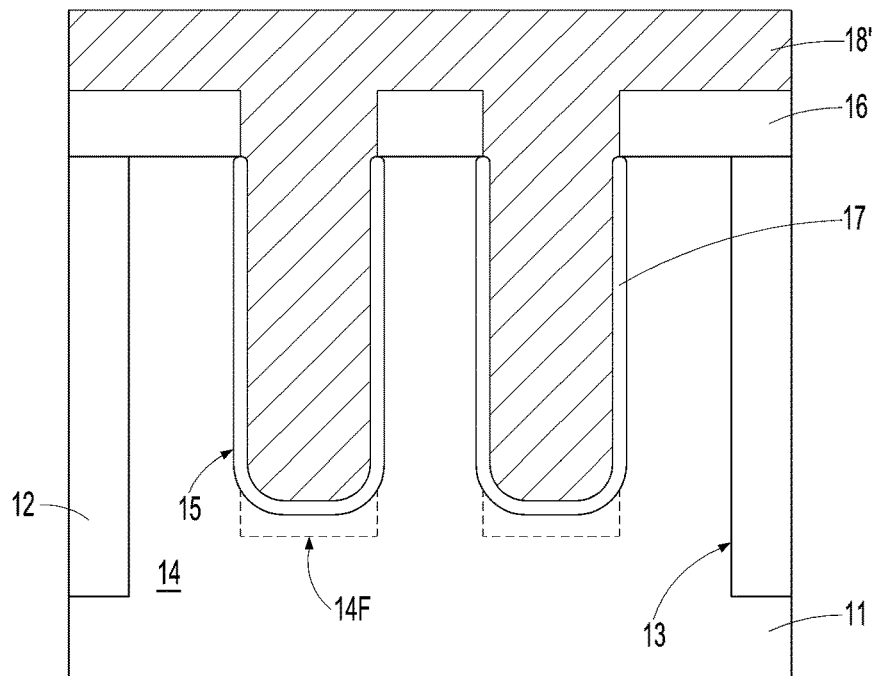

As illustrated in FIG. 3C, a lower gate layer 18' may be formed on the gate dielectric layer 17 and the hard mask layer 16. The lower gate layer 18' may be formed directly on the gate dielectric layer 17 and the hard mask layer 16. The lower gate layer 18' may fill the trench 15 and be in direct contact with the gate dielectric layer 17 covering the bottom and sidewalls of the trench 15. The lower gate layer 18' may be made of or include a low resistivity metal material. The lower gate layer 18' may be made of or include tungsten. The lower gate layer 18' may be formed by deposition including, for example, deposition including, for example, CVD or ALD.

In an embodiment, the lower gate layer 18' may be made of or include a high work function material. The lower gate layer 18' may be made of or include a high work function metal-based material or high work function polysilicon. The high work function polysilicon may be or include P-type polysilicon. The high work function metal may be or include nitrogen-rich titanium nitride (TiN).

Figure 3D:
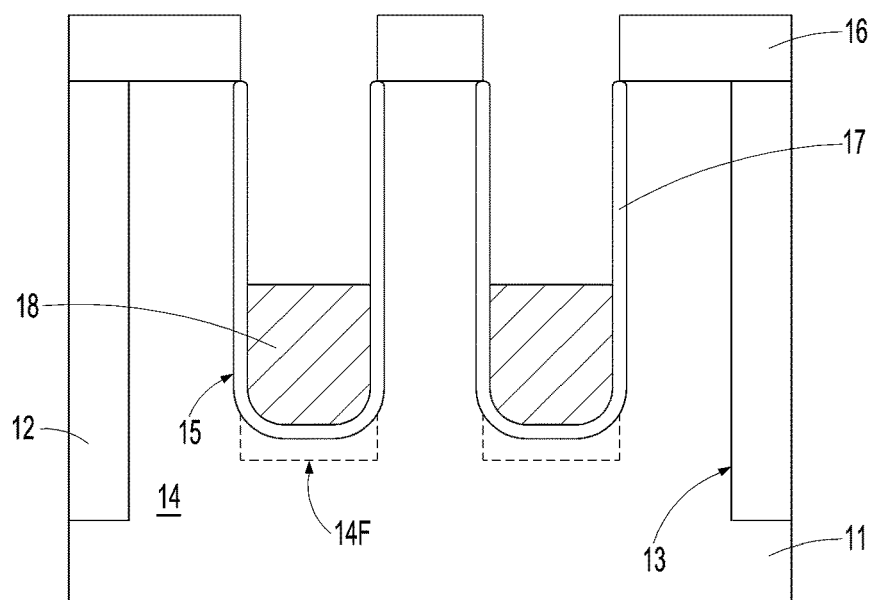

As illustrated in FIG. 3D, a lower gate 18 may be formed in the trench 15. In order to form the lower gate 18, a recessing process may be performed. The recessing process may be or include a dry etch process, for example, an etch-back process. The etch-back process may be performed using plasma. The lower gate 18 may be formed by performing an etch-back process on the lower gate layer 18'. In an embodiment, a planarization process may be performed first to expose the top surface of the hard mask layer 16, and then the etch-back process of the recessing process may be performed on the lower gate layer 18'. The top surface of the lower gate 18 may be recessed at a lower level than the top surface of the active region 14. After the lower gate 18 is formed, a part of the surface of the gate dielectric layer 17 may be exposed.

Figure 3E:
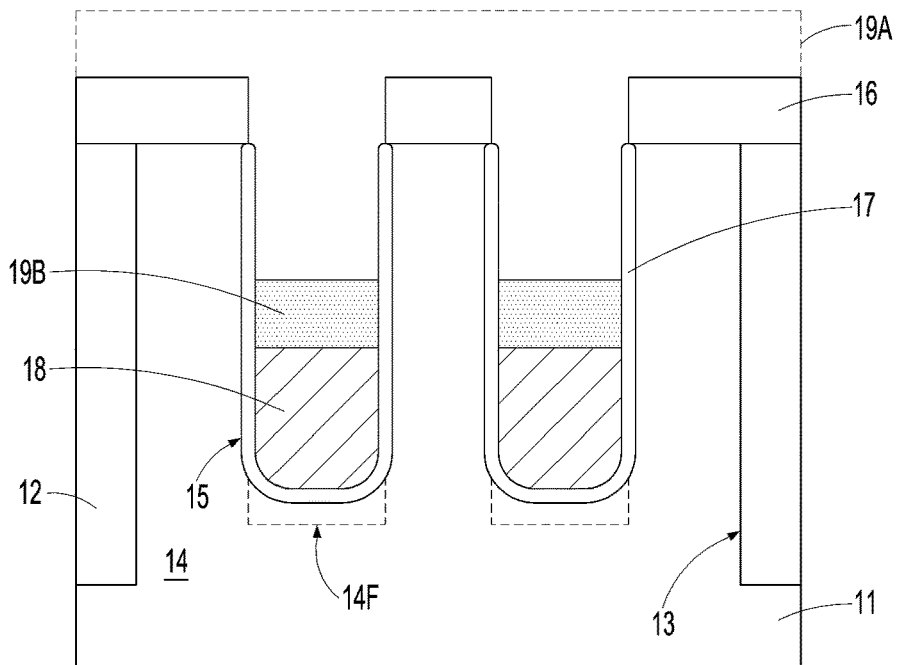

As illustrated in FIG. 3E, a work function layer 19B may be formed on the lower gate 18. The work function layer 19B may be in direct contact with the lower gate 18. In order to form the work function layer 19B, a work function material 19A may be deposited to fill the trench 15 on the lower gate 18, and then a recessing process may be performed on the work function material 19A. The work function material 19A may be formed by deposition including, for example, CVD or ALD. The recessing process on the work function material 19A may include a dry etch process, for example, an etch-back process. The work function layer 19B may be formed by performing the etch-back process on the work function material 19A. In an embodiment, a planarization process may be performed first to expose the top surface of the hard mask layer 16, and then the etch-back process of the recessing process may be performed on the work function material 19A. The top surface of the work function layer 19B may be located at a lower level than the top surface of the active region 14.

The work function layer 19B may have a lower work function than the lower gate 18. The work function layer 19B may have a work function lower than a mid-gap work function of silicon. The work function layer 19B may be referred to as a low work function layer. The work function layer 19B may be made of or include a low work function metal-based material or low work function polysilicon. The low work function polysilicon may be made of or include N-type polysilicon. The low work function metal may be made of or include titanium-rich titanium nitride (TiN). In the present embodiment, the work function layer 19B may be polysilicon doped with an N-type impurity.

After the work function layer 19B is formed, a part of the surface of the gate dielectric layer 17 may be exposed. The work function layer 19B may have a shape of partially filling the trench 15 on the lower gate 18.

Figure 3F:
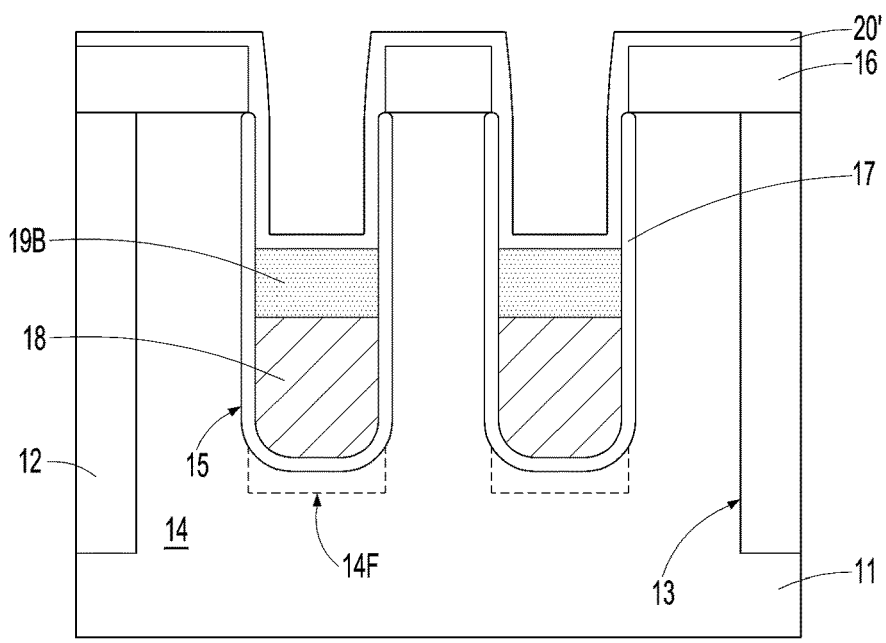

As illustrated in FIG. 3F, a spacer layer 20' may be formed. The spacer layer 20' may be made of or include a material having a selectivity with respect to the etch process on the work function layer 19B. The etch process may be a dry etch process. The spacer layer 20' may be made of or include an oxide. The spacer layer 20' may be made of or include silicon oxide. The spacer layer 20' may include a conformal film deposition (CFD) oxide or ultra low temperature oxide (ULTO). The spacer layer 20' may cover the top surface of the work function layer 19B, the exposed part of the gate dielectric layer 17 and the surface of the hard mask layer 16.

Figure 3G:
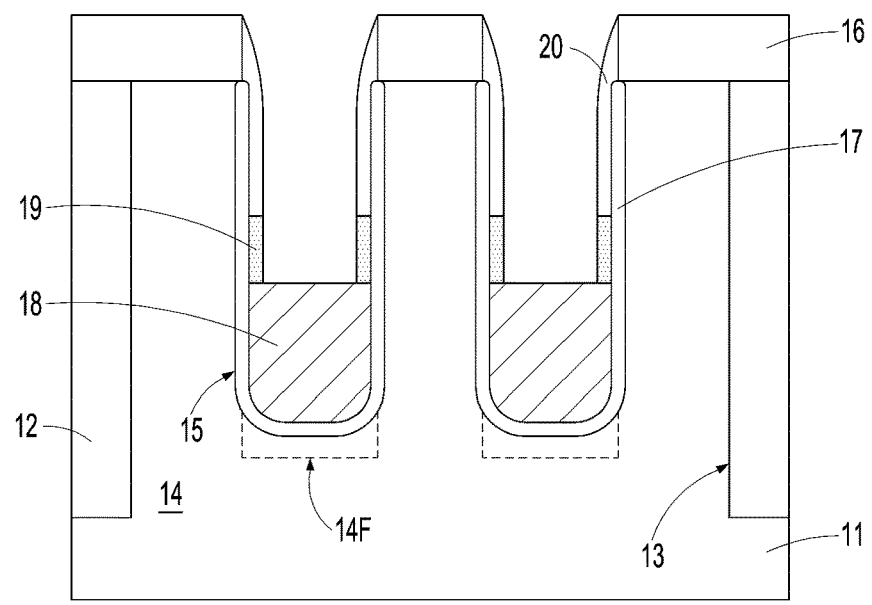

As illustrated in FIG. 3G, spacer 20 may be formed. In order to form the spacer 20, the spacer layer 20' may be etched by an etch-back process. The spacer 20 may cover the exposed part of the gate dielectric layer 17, and the bottom surface of the spacer 20 may contact the edge-side top surface of the work function layer 19B. Most of the top surface of the work function layer 19B may be exposed by the spacer 20. A part of the spacer 20 may cover the exposed part of the gate dielectric layer 17 and the surface of the hard mask layer 16.

Subsequently, vertical gate 19 may be formed. The vertical gate 19 may be formed by etching the work function layer 19B that is not protected by the spacer 20. The vertical gate 19 may be formed by performing a self-aligned etch process on the work function layer 19B, using the spacer 20 as an etch mask. The vertical gate 19 may partially cover the exposed part of the gate dielectric layer 17. The vertical gate 19 may be located over both edges of the lower gate 18.

As described above, since the vertical gate 19 is formed by the self-aligned etch process using the spacer 20, the width and height of the vertical gate 19 may be uniformly formed.

Figure 3H:
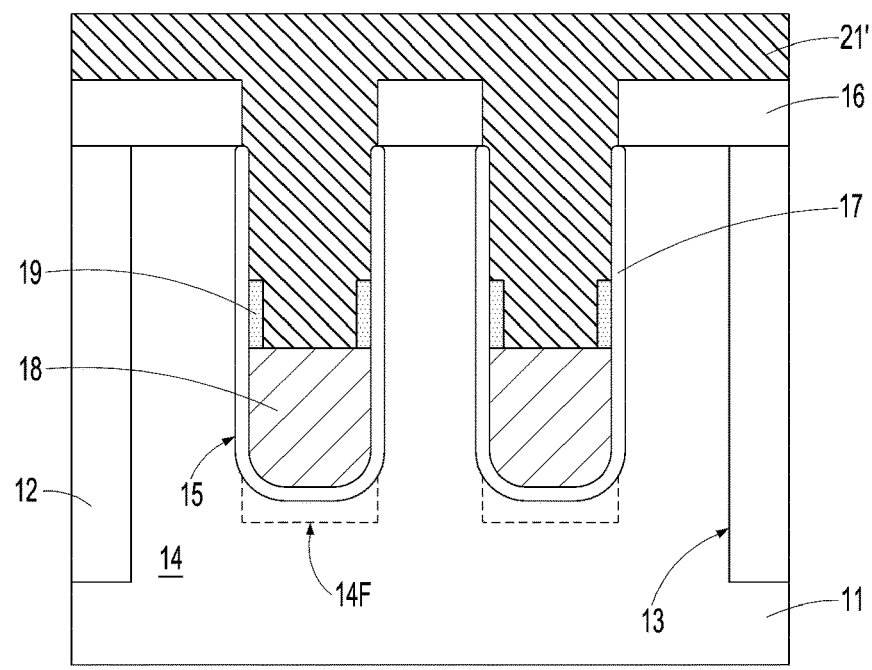

As illustrated in FIG. 3H, the spacer 20 may be removed. After the spacer 20 is removed, a part of the gate dielectric layer 17 which extends at a level higher than the top surface of the vertical gate 19 may be exposed.

Subsequently, an upper gate layer 21' may be formed. The upper gate layer 21' may be formed on the hard mask layer 16 and may fill the trench 15 and especially the space between the inner sidewalls of the vertical gate 19. The upper gate layer 21' may be made of or include a low resistivity material. The upper gate layer 21' may be formed of the same material as the lower gate 18. The upper gate layer 21' and the lower gate 18 may be made of the same material. The upper gate layer 21' may be made of or include a metal-based material. The upper gate layer 21' may be made of or include a metal, metal nitride or a combination thereof. The upper gate layer 21' may be made of or include tungsten, tungsten nitride, titanium nitride or combinations thereof. In an embodiment, the upper gate layer 21' may be made of or include a low work function metal or low work function polysilicon.

Figure 3I:
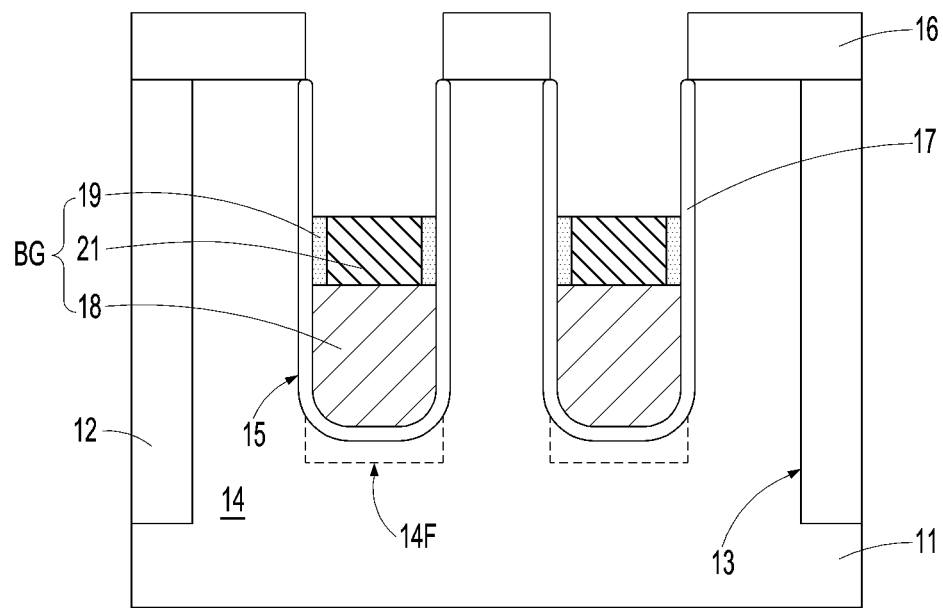

As illustrated in FIG. 3I, a recessing process may be performed on the upper gate layer 21' to form an upper gate 21. The recessing process may be a dry etch process, for example, an etch-back process. In an embodiment, a planarization process may be performed first to expose the top surface of the hard mask layer 16, and then the etch-back process may be performed on the upper gate layer 21'. The top surface of the upper gate 21 may be located at a lower level than the top surface of the active region 14. The upper gate 21 may fill the space between the inner sidewalls of the vertical gate 19. The top surface of the upper gate 21 may be located at the same level as the top surface of the vertical gate 19.

The lower gate 18, the vertical gate 19 and the upper gate 21 form gate electrode BG. When each of the lower and upper gates 18 and 21 are formed of a metal-based material, the volume of the metal-based material occupying the gate electrode BG may be increased. Accordingly, the resistance of the gate electrode BG may be decreased.

Figure 3J:
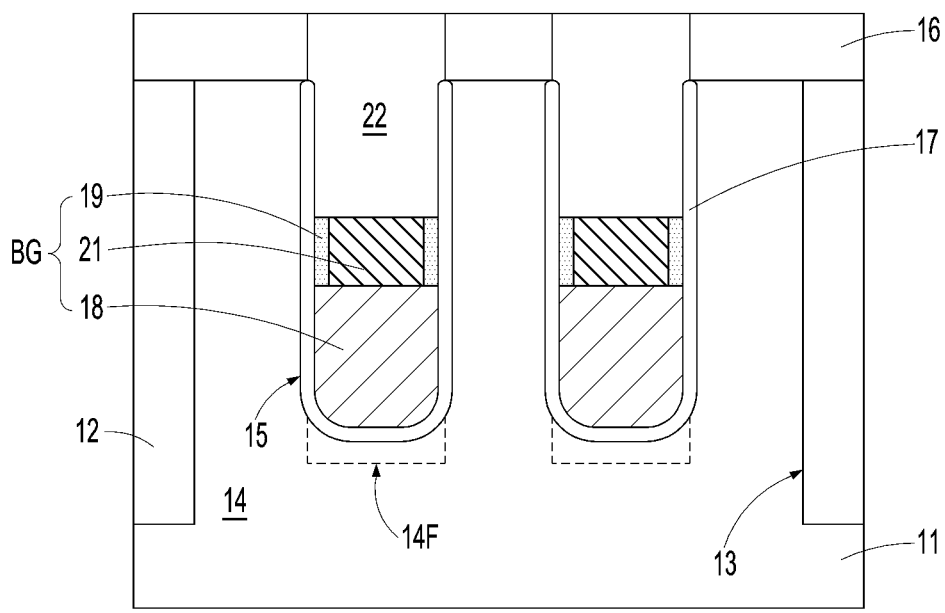

As illustrated in FIG. 3J, a capping layer 22 may be formed on the upper gate 21 to fill the remaining empty space of the trench 15. The capping layer 22 may be made of or include a dielectric material. The capping layer 22 may be made of or include silicon nitride. The capping layer 22 may have a multi-layered structure such as an oxide-nitride-oxide (ONO) structure.

Subsequently, a planarization process may be performed on the capping layer 22 to expose the top surface of the hard mask layer 16. Accordingly, the capping layer 22 filling the trench 15 may remain.

The bottom surface of the capping layer 22 may contact, for example, directly contact, the upper gate 21 and the vertical gate 19. Both sidewalls of the capping layer 22 may contact, for example, directly contact, the gate dielectric layer 17 and the hard mask layer 16.

According to the processes described above, a buried gate structure may be formed. The buried gate structure may include the gate dielectric layer 17, the gate electrode BG and the capping layer 22. The gate electrode BG may include the lower gate 18, the vertical gate 19 and the upper gate 21. The top surfaces of the upper gate 21 and the vertical gate 19 are located at a lower level than the top surface of the active region 14. The upper gate 21 may fill the space between the inner sidewalls of the vertical gate 19. The top surfaces of the upper gate 21 and the vertical gate 19 may be located at the same level. The vertical gate 19 may directly contact the upper gate 21, the gate dielectric layer 17, and the lower gate 18.

Figure 3K:
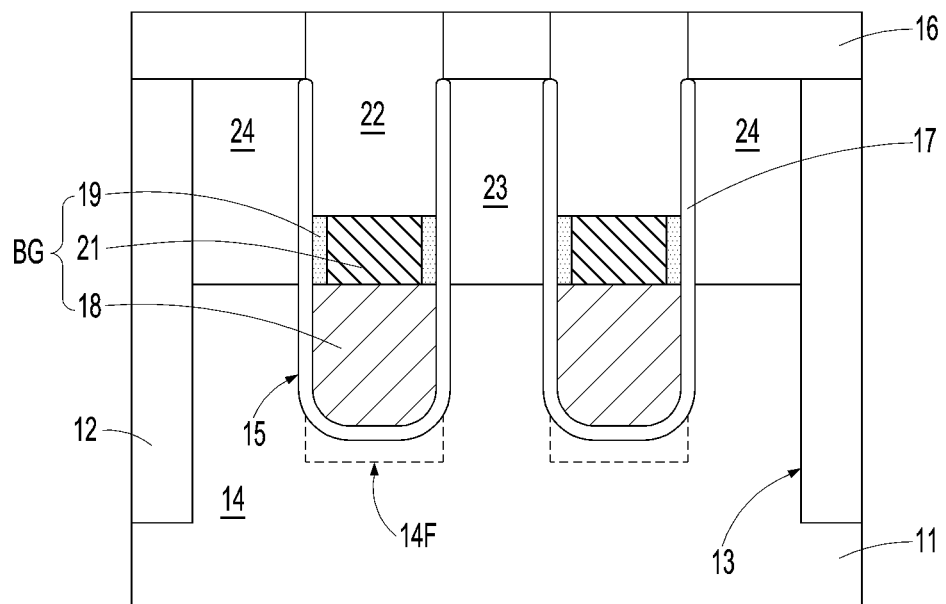

After the capping layer 22 may be formed, as illustrated in FIG. 3K, an impurity doping process may be performed through an implanting process or other suitable doping techniques. Accordingly, first and second doped regions 23 and 24 may be formed in the substrate 11. Each of the first and second doped regions 23 and 24 may have an effective depth to laterally overlap the upper gate 21 and the vertical gate 19. The lower gate 18 may not laterally overlap the first and second doped regions 23 and 24. The first and second doped regions 23 and 24 may be referred to as first and second source/drain regions, respectively.

As the first and second doped regions 23 and 24 are formed, a channel (refer to reference numeral "106" of FIG. 2A) may be defined along the surface of the trench 15.

In the present embodiment, the vertical gate 19 may be formed by performing the self-aligned etch process using the spacer 20. The described buried gate electrode structure with the vertical gate 19 is advantageous because it substantially reduces or prevents GIDL.

Figure 4:
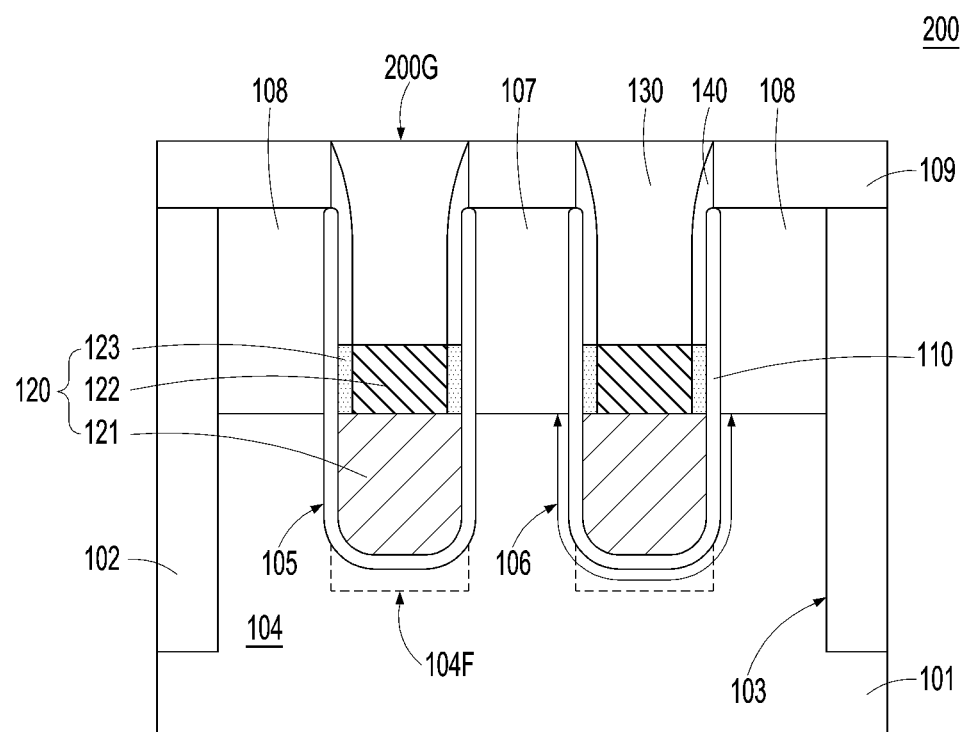
FIG. 4 is a cross-sectional view illustrating a semiconductor device in accordance with an embodiment of the present invention.

FIG. 4 is a cross-sectional view illustrating a semiconductor device 200 in accordance with an embodiment of the present invention. The various features of the semiconductor device 200 illustrated in FIG. 4 may be similar to those of the semiconductor device 100 illustrated in FIG. 2A, except for a buried gate structure 200G. Hereinafter, in the present embodiment, detailed descriptions of various features overlapping those of the semiconductor device 100 may be omitted.

Referring to FIG. 4, the semiconductor device 200 may include the buried gate structure 200G, and first and second doped regions 107 and 108. An isolation layer 102 and an active region 104 may be formed in substrate 101. The first and second doped regions 107 and 108 may be formed in the active region 104. Trench 105 that crosses the active region 104 and the isolation layer 102 may be formed. The buried gate structure 200G may be formed in the trench 105. A channel 106 may be formed between the first and second doped regions 107 and 108 the along the profile of the trench 105 that is coextensive with the profile of the lower gate 121 of the buried gate structure 200G.

The buried gate structure 200G may be embedded in the trench 105. The buried gate structure 200G may be extended into the isolation layer 102 while being disposed in the active region 104 between the first and second doped regions 107 and 108. A fin region 104F may be located in the active region 104 below the buried gate structure 200G.

The buried gate structure 200G may include the gate dielectric layer 110 covering the bottom surface and sidewalls of the trench 105, the gate electrode 120 and the capping layer 130 which are sequentially stacked to fill the trench 105 on the gate dielectric layer 110. The buried gate structure 200G may further include spacer 140 between the capping layer 130 and the gate dielectric layer 110.

The gate electrode 120 may include the lower gate 121, the upper gate 122 and the vertical gate 123. The spacer 140 may directly contact the top surface of the vertical gate 123. The spacer 140 may cover a part of the gate dielectric layer 110.

The sidewalls of the spacer 140 and the sidewalls of the vertical gate 123 may be self-aligned. The spacer 140 may be made of or include a dielectric material. The spacer 140 may be made of or include an oxide. The spacer 140 may include a conformal film deposition (CFD) oxide or ultra low temperature oxide (ULTO). In top view, the ends of the vertical gate 123 may be connected to each other, and surrounding the sidewalls of the upper gate 122. In top view, the ends of the spacer 140 may be connected to each other, and surrounding the sidewalls of the capping layer 130.

Figure 5A:
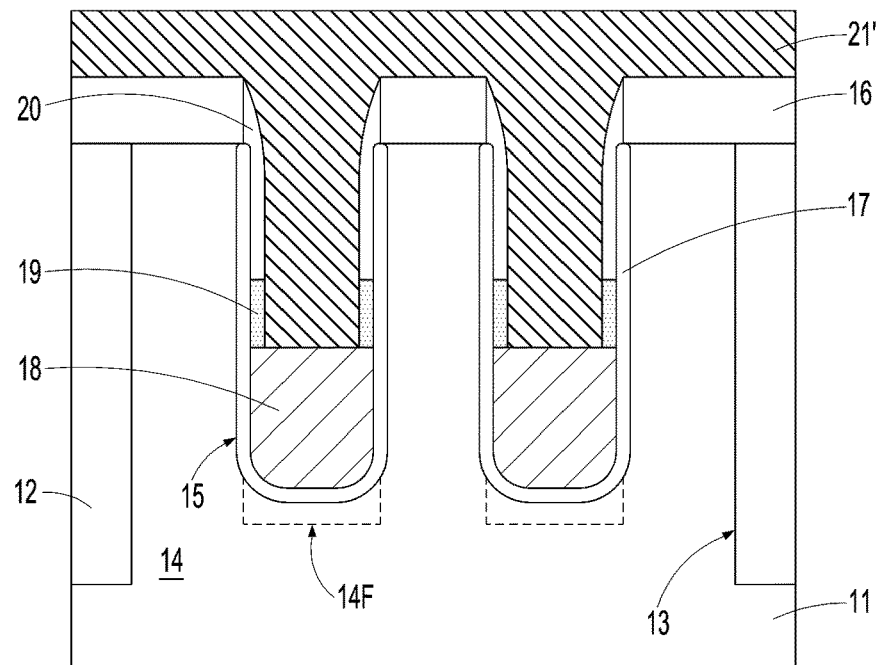
FIGS. 5A to 5C are cross-sectional views illustrating an example of a method for forming the semiconductor device illustrated in FIG. 4.
Figure 5B:
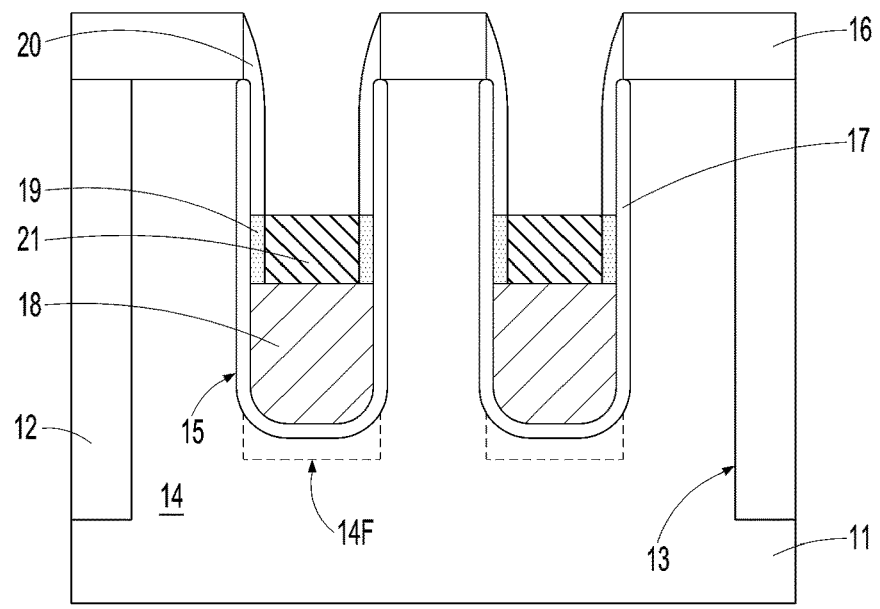
Figure 5C:
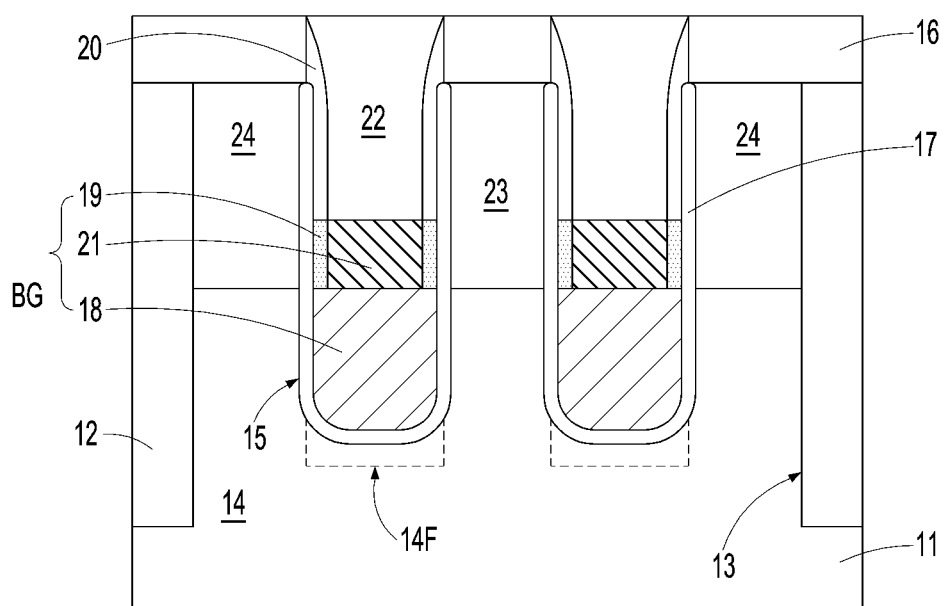

FIGS. 5A to 5C are cross-sectional views illustrating an example of a method for forming the semiconductor device 200 illustrated in FIG. 4. The method illustrated in 5A to 5C may be similar to the method illustrated in FIGS. 3A to 3L.

According to the processes illustrated in FIG. 3A to 3G, a spacer 20 and vertical gate 19 may be formed.

Subsequently, as illustrated in FIG. 5A, an upper gate layer 21' may be formed to fill a trench 15 on a lower gate 18 and the spacer 20. The upper gate layer 21' may be made of or include a low resistivity material. The upper gate layer 21' may be formed of the same material as the lower gate 18. The upper gate layer 21' and the lower gate 18 may be made of the same material. The upper gate layer 21' may be made of or include a metal-based material. The upper gate layer 21' may be made of or include a metal, metal nitride or a combination thereof. The upper gate layer 21' may be made of or include tungsten, tungsten nitride, titanium nitride or combinations thereof. In an embodiment, the upper gate layer 21' may be made of or include a low work function metal or low work function polysilicon.

As illustrated in FIG. 5B, a recessing process may be performed on the upper gate layer 21' to form an upper gate 21. The recessing process on the upper gate layer 21' may be performed by a dry etch process, for example, an etch-back process. In an embodiment, a planarization process may be performed first, to expose the top surface of hard mask layer 16 and then, the etch-back process of the recessing process may be performed on the upper gate layer 21'. The top surface of the upper gate 21 may be located at a lower level than the top surface of an active region 14. The upper gate 21 may fill the space between the inner sidewalls of the vertical gate 19. The top surface of the upper gate 21 may be located at the same level as the top surface of the vertical gate 19.

As illustrated in FIG. 5C, a capping layer 22 may be formed on the upper gate 21. The capping layer 22 may be made of or include a dielectric material. The capping layer 22 may include silicon nitride. The capping layer 22 may have an oxide-nitride-oxide (ONO) structure. The capping layer 22 may be planarized to expose the surface of the hard mask layer 16.

The bottom surface of the capping layer 22 may contact the upper gate 21 and the vertical gate 19. Both sidewalls of the capping layer 22 may contact the spacer 20. The spacer 20 may be formed between the capping layer 22 and a gate dielectric layer 17. The bottom surface of the spacer 20 may contact the top surface of the vertical gate 19.

According to the processes described above, a buried gate structure may be formed. The buried gate structure may include the gate dielectric layer 17, a gate electrode BG, the spacer 20 and the capping layer 22. The gate electrode BG may include the lower gate 18, the vertical gate 19 and the upper gate 21. The top surfaces of the upper gate 21 and the vertical gate 19 are located at a lower level than the top surface of the active region 14.

After the capping layer 22 may be formed, an impurity doping process may be performed by an implanting process or any other suitable doping technique. Accordingly, first and second doped regions 23 and 24 are formed in substrate 11. Each of the first and second doped regions 23 and 24 may have a depth laterally overlapping the upper gate 21 and the vertical gate 19. The lower gate 18 may not laterally overlap the first and second doped regions 23 and 24. The first and second doped regions 23 and 24 may be referred to as first and second source/drain regions, respectively.

Figure 6A:
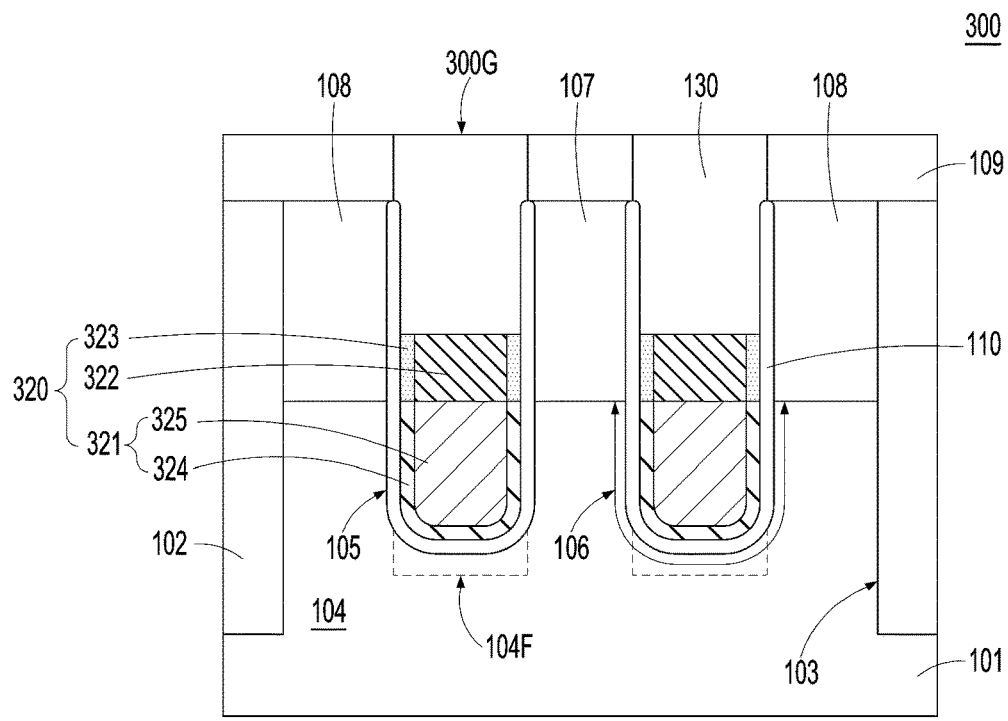
FIGS. 6A and 6B are cross-sectional views illustrating semiconductor devices in accordance with embodiments of the present invention.
Figure 6B:
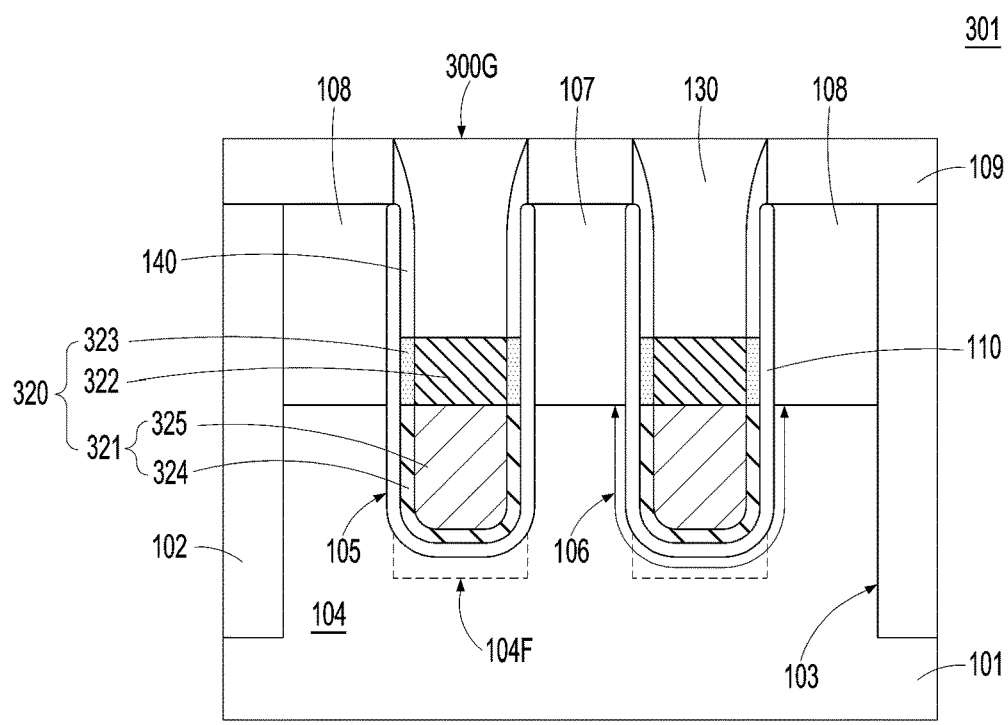

FIGS. 6A and 6B are cross-sectional views illustrating semiconductor devices 300 and 301 in accordance with an embodiment of the present invention. The various features of the semiconductor device 300 illustrated in FIG. 6A may be similar to those of the semiconductor device 100 illustrated in FIG. 2A, except for buried gate structure 300G. Likewise, the various features of the semiconductor device 301 illustrated in FIG. 6B may be similar to those of the semiconductor device 200 illustrated in FIG. 4, except for buried gate structure 301G. Hereinafter, in the present embodiment, detailed descriptions of various features overlapping those of the semiconductor devices 100 and 200 may be omitted.

Referring to FIG. 6A, the semiconductor device 300 may include the buried gate structure 300G, and first and second doped regions 107, 108. An isolation layer 102 and an active region 104 may be formed in substrate 101. The first and second doped regions 107 and 108 may be formed in the active region 104. Trench 105 that crosses the active region 104 and the isolation layer 102 may be formed. The buried gate structure 300G may be formed in the trench 105. A channel 106 may be formed between the first and second doped regions 107 and 108 by the buried gate structure 300G. The channel 106 may be defined along the profile of the trench 105.

The buried gate structure 300G may be embedded in the trench 105. The buried gate structure 300G may be extended into the isolation layer 102 while being disposed in the active region 104 between the first and second doped regions 107 and 108. A fin region 104F may be located in the active region 104 below the buried gate structure 300G.

The buried gate structure 300G may include gate dielectric layer 110 covering the bottom surface and sidewalls of the trench 105, a gate electrode 320 and capping layer 130 sequentially stacked to fill the trench 105 on the gate dielectric layer 110.

The gate electrode 320 may be made of or include a lower gate 321, an upper gate 322 and vertical gate 323. The upper gate 322 and the vertical gate 323 may correspond to the upper gate 122 and the vertical gate 123 illustrated in FIG. 2A.

The lower gate 321 may include a barrier layer 324 and a low resistivity gate electrode 325. The barrier layer 324 may be conformally formed on the surface of the gate dielectric layer 110. The barrier layer 324 may be in direct contact with the gate dielectric layer 110. The barrier layer 324 may be made of or include a metal-based material. The barrier layer 324 may be made of or include metal nitride. The barrier layer 324 may be made of or include titanium nitride or tantalum nitride. The low resistivity gate electrode 325 may be formed on the barrier layer 324 to fill the lower portion of the trench 105. The low resistivity gate electrode 325 may be made of or include a low resistivity metal, for example, tungsten. When the barrier layer 324 includes titanium nitride and the low resistance gate electrode 325 includes tungsten, the lower gate 321 may be a TiN/W stack. The upper gate 322 may be made of or include tungsten or titanium nitride. The vertical gate 323 may be made of or include a low work function material, for example, N-type polysilicon.

Referring to FIG. 6B, the semiconductor device 301 may include the buried gate structure 301G, and first and second doped regions 107, 108. An isolation layer 102 and an active region 104 may be formed in substrate 101. The first and second doped regions 107 and 108 may be formed in the active region 104. Trench 105 that crosses the active region 104 and the isolation layer 102 may be formed. The buried gate structure 301G may be formed in the trench 105. A channel 106 may be formed between the first and second doped regions 107 and 108 by the buried gate structure 301G. The channel 106 may be defined along the profile of the trench 105.

The buried gate structure 301G may be embedded in the trench 105. The buried gate structure 301G may be extended into the isolation layer 102 while being disposed in the active region 104 between the first and second doped regions 107 and 108. A fin region 104F may be located in the active region 104 below the buried gate structure 301G.

The buried gate structure 301G may include gate dielectric layer 110 covering the bottom surface and sidewalls of the trench 105, a gate electrode 320 and capping layer 130 sequentially stacked to fill the trench 105 on the gate dielectric layer 110. The buried gate structure 301G may further include spacer 140 between the capping layer 130 and the gate dielectric layer 110.

The gate electrode 320 may be made of or include a lower gate 321, an upper gate 322 and vertical gate 323. The spacer 140 may directly contact the top surface of the vertical gate 323. The sidewalls of the spacer 140 and the sidewalls of the vertical gate 323 may be self-aligned. The spacer 140 may be made of or include a dielectric material. The spacer 140 may be made of or include an oxide. The spacer 140 may include a conformal film deposition (CFD) oxide or ultra low temperature oxide (ULTO).

The lower gate 321 may include a barrier layer 324 and a low resistance gate electrode 325. The barrier layer 324 may be conformally formed on the surface of the gate dielectric layer 110. The barrier layer 324 may be made of or include a metal-based material. The barrier layer 324 may be made of or include metal nitride. The barrier layer 324 may be made of or include titanium nitride or tantalum nitride. The low resistance gate electrode 325 may fill the lower portion of the trench 105 in the barrier layer 324. The low resistance gate electrode 325 may be made of or include tungsten. When the barrier layer 324 includes titanium nitride and the low resistance gate electrode 325 includes tungsten, the lower gate 321 may be a TiN/W stack. The upper gate 322 may be made of or include tungsten or titanium nitride. The vertical gate 323 may be made of or include a low work function material, for example, N-type polysilicon.

FIGS. 7A to 7G are cross-sectional views illustrating an example of a method for forming a semiconductor device in accordance with an embodiment of the present invention. FIGS. 7A to 7G illustrate an example of a method for forming the semiconductor device 300 illustrated in FIG. 6A.

Figure 7A:
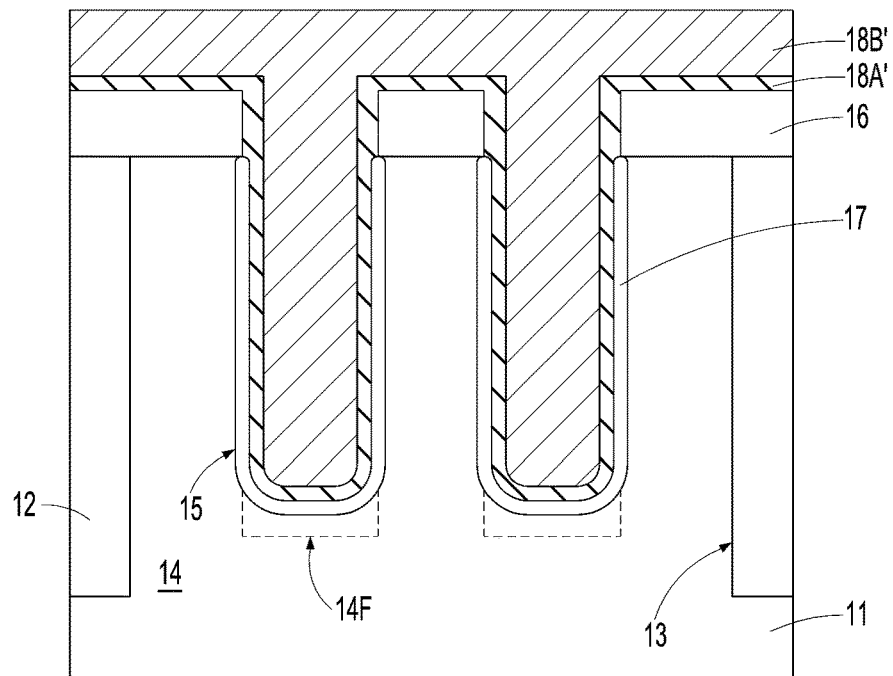
FIGS. 7A to 7G are cross-sectional views illustrating an example of a method for forming a semiconductor device in accordance with an embodiment of the present invention.

As illustrated in FIG. 7A, an isolation layer 12 is formed in a substrate 11. An active region 14 is defined by the isolation layer 12. The isolation layer 12 may be formed by a shallow trench isolation (STI) process. For example, an isolation trench 13 is formed by etching the substrate 11. The isolation trench 13 is filled with a dielectric material to form the isolation layer 12. The isolation layer 12 may be made of or include silicon oxide, silicon nitride or a combination thereof. The isolation trench 13 may be filled with a dielectric material through CVD or another deposition process. Also, a planarization process such as chemical-mechanical polishing (CMP) may be additionally used.

A trench 15 may be formed in the substrate 11. The trench 15 may have a line shape crossing the active region 14 and the isolation layer 12. The trench 15 may be formed by etching the substrate 11 using hard mask layer 16 as an etch mask. The hard mask layer 16 may be formed on the substrate 11, and have a line-shaped opening. The hard mask layer 16 may be formed of a material having an etch selectivity with respect to the substrate 11. The hard mask layer 16 may be or include silicon oxide, such as Tetra-Ethyl-Ortho-Silicate (TEOS). The trench 15 may be formed to be shallower than the isolation trench 13. The trench 15 may be sufficiently deep to allow for forming subsequently a large gate electrode having a large average cross-sectional area. In this way, the resistance of the gate electrode may be decreased. In an embodiment, the bottom edges of the trench 15 may have a curvature.

Subsequently, a fin region 14F may be formed. The fin region 14F may be formed by selectively recessing the isolation layer 12 below the trench 15. For the structure of the fin region 14F, the reference is made to the fin region 104F of FIG. 2B.

Subsequently, a gate dielectric layer 17 may be formed on the surface of the trench 15. Before the gate dielectric layer 17 is formed, the surface of the trench 15 that is damaged from the etch process may be recovered. For example, sacrificial oxide may be formed by a thermal oxidation treatment, and then the sacrificial oxide may be removed.

The gate dielectric layer 17 may be formed by a thermal oxidation process. The gate dielectric layer 17 may be made of or include silicon oxide.

In an embodiment, the gate dielectric layer 17 may be formed by a deposition process, such as CVD or ALD. The gate dielectric layer 17, which is formed by the deposition process, may be made of or include a high-k material, oxide, nitride, oxynitride or combinations thereof. The high-k material may be or include a hafnium-containing material. The hafnium-containing material may be or include hafnium oxide, hafnium silicon oxide, hafnium silicon oxynitride or combinations thereof. In an embodiment, the high-k material may be or include lanthanum oxide, lanthanum aluminum oxide, zirconium oxide, zirconium silicon oxide, zirconium silicon oxynitride, aluminum oxide or combinations thereof. As the high-k material, other publicly-known high-k materials may also be selectively used. The gate dielectric layer 17 may be made of or include a material having a high areal density of oxygen atoms.

Subsequently, a barrier material 18A' may be formed on the gate dielectric layer 17 and the hard mask layer 16. The barrier material 18A' may be conformally formed on the surface of the gate dielectric layer 17. The barrier material 18A' may be made of or include a metal-based material. The barrier material 18A' may be made of or include metal nitride. The barrier material 18A' may be made of or include titanium nitride or tantalum nitride. The barrier material 18A' may be formed by ALD or CVD.

Subsequently, a low resistivity metal material 18B' may be formed on the barrier material 18A'. The low resistivity metal material 18B' may fill the trench 15 on the barrier material 18A'. The low resistivity metal material 18B' may include a low resistivity metal. The low resistivity metal material 18B' may be or include tungsten. The low resistivity metal material 18B' may be formed by deposition including, for example, CVD or ALD.

Figure 7B:
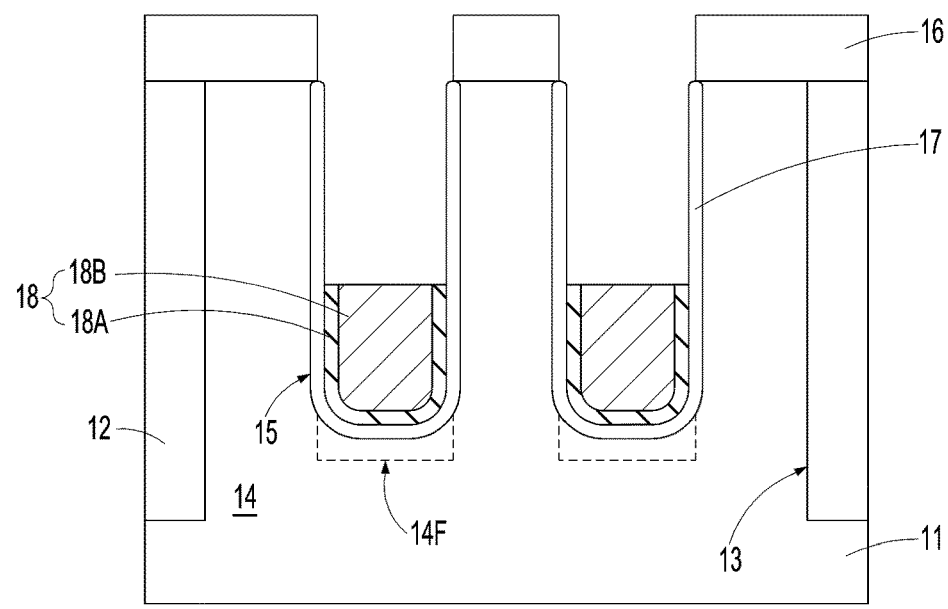

As illustrated in FIG. 7B, a lower gate 18 may be formed in the trench 15. The lower gate 18 may include a barrier layer 18A and a low resistivity metal layer 18B. In order to form the barrier layer 18A and the low resistivity metal layer 18B, a recessing process may be performed. The recessing process may include a dry etch process, for example, an etch-back process. The etch-back process may be performed using plasma. The barrier layer 18A may be formed by performing the etch-back process on the barrier material 18A'. The low resistivity metal layer 18B is formed by performing the etch-back process on the low resistivity metal material 18B'. In an embodiment, a planarization process may be performed first to expose the top surface of the hard mask layer 16, and then the etch-back process of the recessing process may be performed on the barrier material 18A' and the low resistivity metal material 18B'. The top surface of the barrier layer 18A may be located at the same level as the top surface of the low resistivity metal layer 18B.

The top surfaces of the barrier layer 18A and the low resistivity metal layer 18B may be recessed at a lower level than the top surface of the active region 14. The barrier layer 18A may correspond to the barrier layer 324 of FIG. 6A, and the low resistivity metal layer 18B may correspond to the low resistivity gate electrode 325 of FIG. 6A.

Figure 7C:
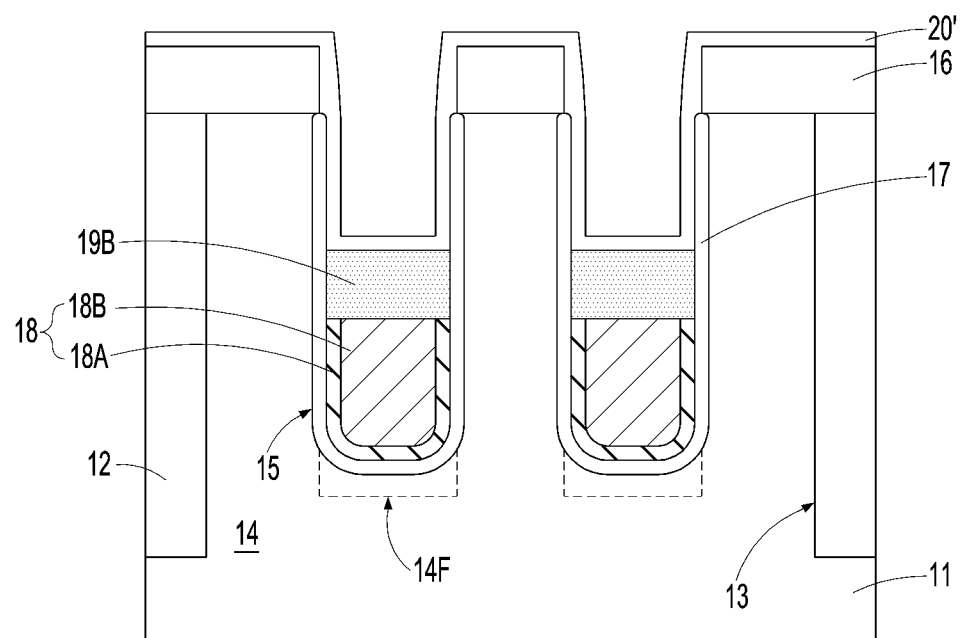

As illustrated in FIG. 7C, a work function layer 19B may be formed on the lower gate 18. In order to form the work function layer 19B, a work function material 19A may be deposited to fill the trench 15 on the lower gate 18, and then a recessing process may be performed on the work function material 19A. The work function material 19A may be formed by deposition including, for example, CVD or ALD. The recessing process on the work function material 19A may include a dry etch process, for example, an etch-back process. The work function layer 19B may be formed by performing the etch-back process on the work function material 19A. In an embodiment, a planarization process may be performed first to expose the top surface of the hard mask layer 16, and then the etch-back process of the recessing process may be performed on the work function material 19A. The top surface of the work function layer 19B may be located at a lower level than the top surface of the active region 14.

The work function layer 19B may have a work function lower than a mid-gap work function of silicon. The work function layer 19B may be made of or include a low work function metal or low work function polysilicon. The low work function polysilicon may be made of or include N-type polysilicon. The low work function metal may be made of or include titanium-rich titanium nitride (TiN). In the present embodiment, the work function layer 19B may be polysilicon doped with an N-type impurity.

After the work function layer 19B is formed, a part of the surface of the gate dielectric layer 17 may be exposed. The work function layer 19B may have a shape of partially filling the trench 15 on the lower gate 18.

Figure 7D:
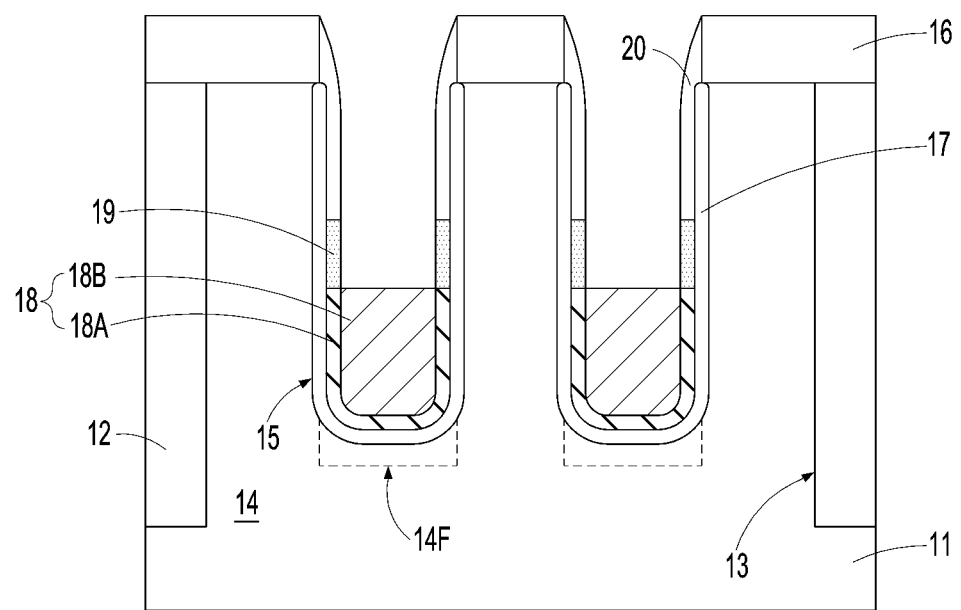

As illustrated in FIG. 7D, spacer 20 may be formed. In order to form the spacer 20, a deposition process and an etch-back process may be performed on a spacer layer 20'. The spacer 20 may cover the exposed part of the gate dielectric layer 17, and the bottom surface of the spacer 20 may contact the edge-side top surface of the work function layer 19B. Most of the top surface of the work function layer 19B may be exposed by the spacer 20. A part of the spacer 20 may cover the exposed part of the gate dielectric layer 17 and the surface of the hard mask layer 16.

Subsequently, vertical gate 19 may be formed. The vertical gate 19 may be formed by etching the work function layer 19B. The vertical gate 19 may be formed by performing a self-aligned etch process on the work function layer 19B, using the spacer 20 as an etch mask. The vertical gate 19 may partially cover the exposed part of the gate dielectric layer 17. The vertical gate 19 may be located over both edges of the lower gate 18.

As described above, since the vertical gate 19 is formed by the self-aligned etch process using the spacer 20, the width and height of the vertical gate 19 may be uniformly formed.

Figure 7E:
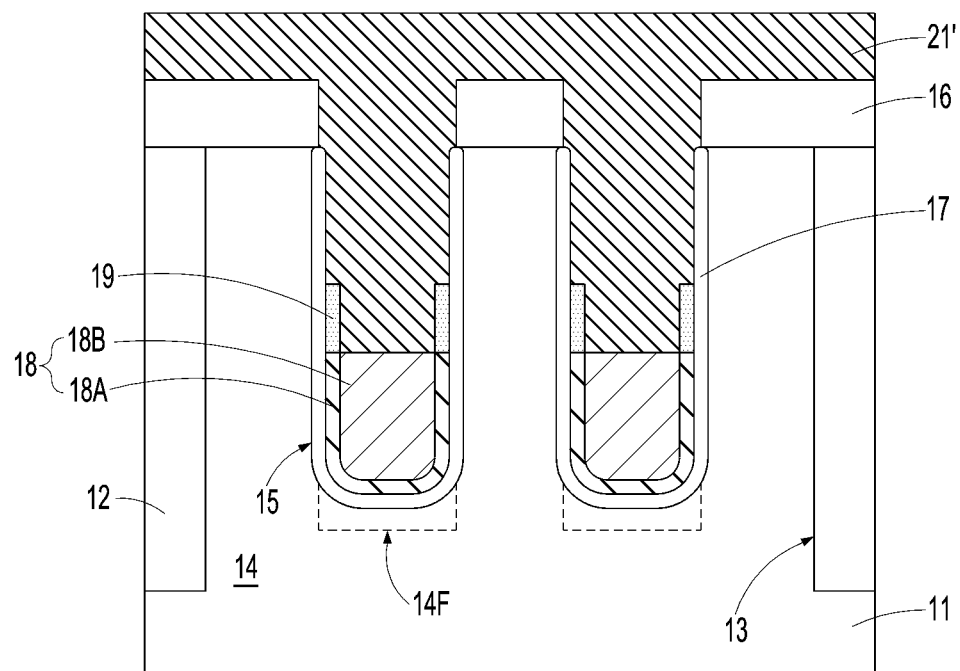

As illustrated in FIG. 7E, the spacer 20 may be removed. An upper gate layer 21' may be formed on the lower gate 18 and the hard mask layer 16 to fill the space between the inner sidewalls of the vertical gate 19. The upper gate layer 21' may be made of or include a low resistivity material. The upper gate layer 21' may be formed of the same material as the lower gate 18. The upper gate layer 21' and the lower gate 18 may be made of the same material. The upper gate layer 21' may be made of or include a metal-based material. The upper gate layer 21' may be made of or include a metal, metal nitride or a combination thereof. The upper gate layer 21' may be made of or include tungsten, tungsten nitride, titanium nitride or combinations thereof. In an embodiment, the upper gate layer 21' may be made of or include a low work function metal or low work function polysilicon.

Figure 7F:
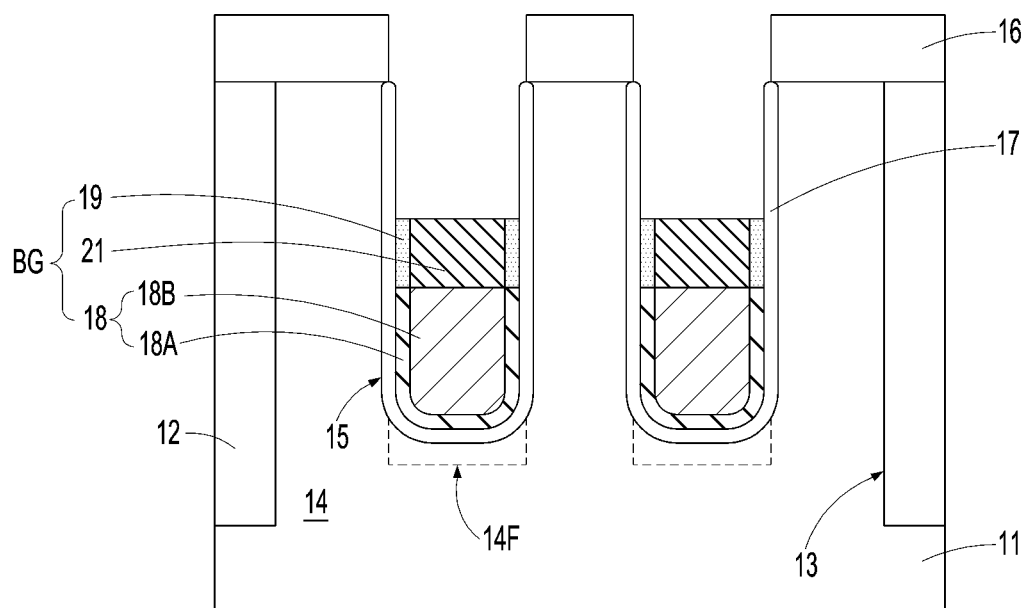

As illustrated in FIG. 7F, a recessing process may be performed on the upper gate layer 21' to form an upper gate 21. The recessing process on the upper gate layer 21' may be performed by a dry etch process, for example, an etch-back process. In an embodiment, a planarization process may be performed first to expose the top surface of the hard mask layer 16, and then the etch-back process of the recessing process may be performed on the upper gate layer 21'. The top surface of the upper gate 21 may be located at a lower level than the top surface of the active region 14. The upper gate 21 may fill the space between the inner sidewalls of the vertical gate 19. The top surface of the upper gate 21 may be located at the same level as the top surface of the vertical gate 19.

The lower gate 18, the vertical gate 19 and the upper gate 21 form gate electrode BG. When each of the lower and upper gates 18 and 21 are formed of a metal-based material, the volume of the metal-based material occupying the gate electrode BG may be increased. Accordingly, the resistance of the gate electrode BG may be decreased.

Figure 7G:
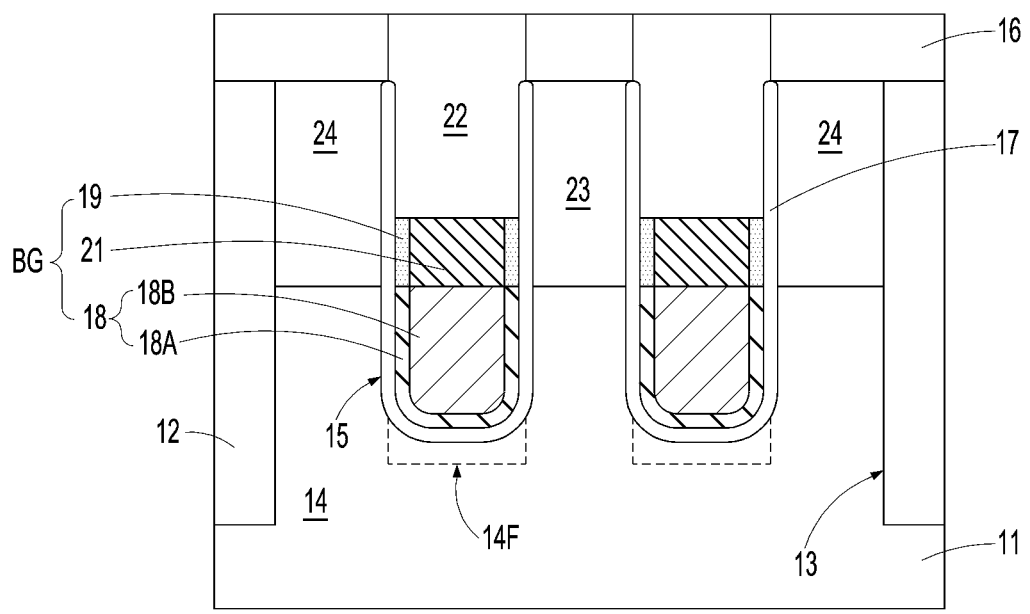

As illustrated in FIG. 7G, a capping layer 22 may be formed on the upper gate 21 and the vertical gate 19. The capping layer 22 may be made of or include a dielectric material. The capping layer 22 may include silicon nitride. The capping layer 22 may have an oxide-nitride-oxide (ONO) structure. The bottom surface of the capping layer 22 may contact the upper gate 21 and the vertical gate 19. Both sidewalls of the capping layer 22 may contact the gate dielectric layer 17 and the hard mask layer 16.

According to the processes described above, a buried gate structure may be formed. The buried gate structure may include the gate dielectric layer 17, the gate electrode BG and the capping layer 22. The gate electrode BG may include the lower gate 18, the vertical gate 19 and the upper gate 21. The top surfaces of the upper gate 21 and the vertical gate 19 are located at a lower level than the top surface of the active region 14. The upper gate 21 may fill the space between the inner sidewalls of the vertical gate 19. The top surfaces of the upper gate 21 and the vertical gate 19 may be located at the same level.

After the capping layer 22 may be formed, an impurity doping process is performed through an implanting process or other doping techniques. Accordingly, first and second doped regions 23 and 24 are formed in the substrate 11. Each of the first and second doped regions 23 and 24 may have a depth laterally overlapping the upper gate 21 and the vertical gate 19. The lower gate 18 may not laterally overlap the first and second doped regions 23 and 24. The first and second doped regions 23 and 24 may be referred to as first and second source/drain regions, respectively.

Figure 8A:
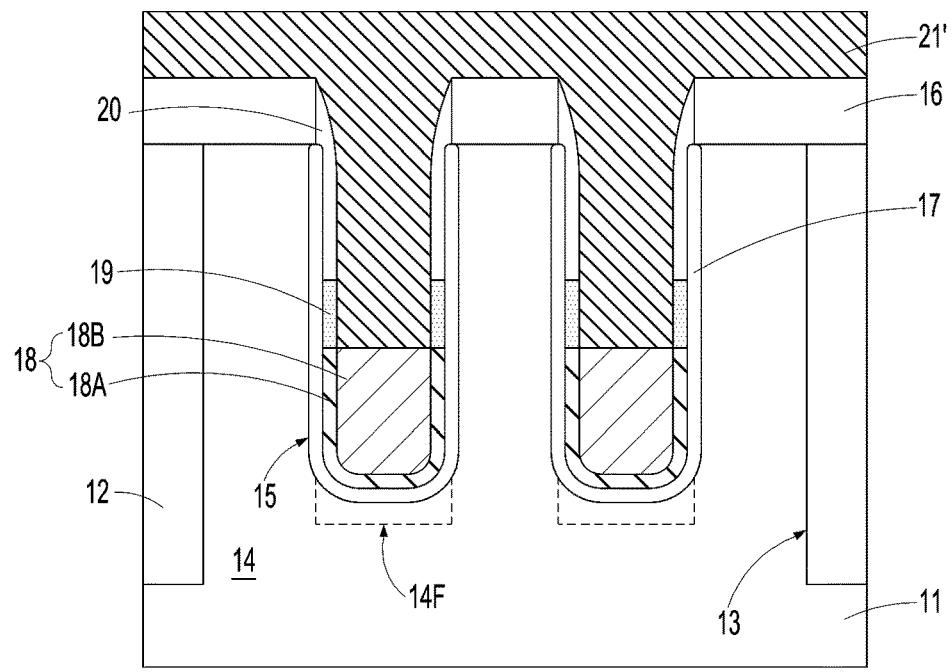
FIGS. 8A to 8C are cross-sectional views illustrating an example of a method for forming the semiconductor device illustrated in FIG. 6B.
Figure 8B:
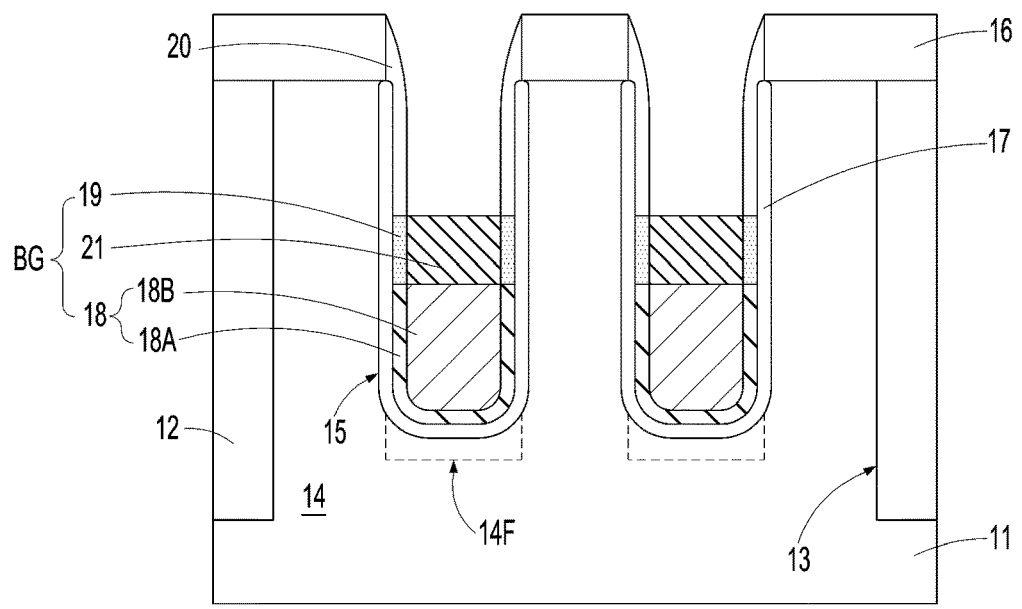
Figure 8C:
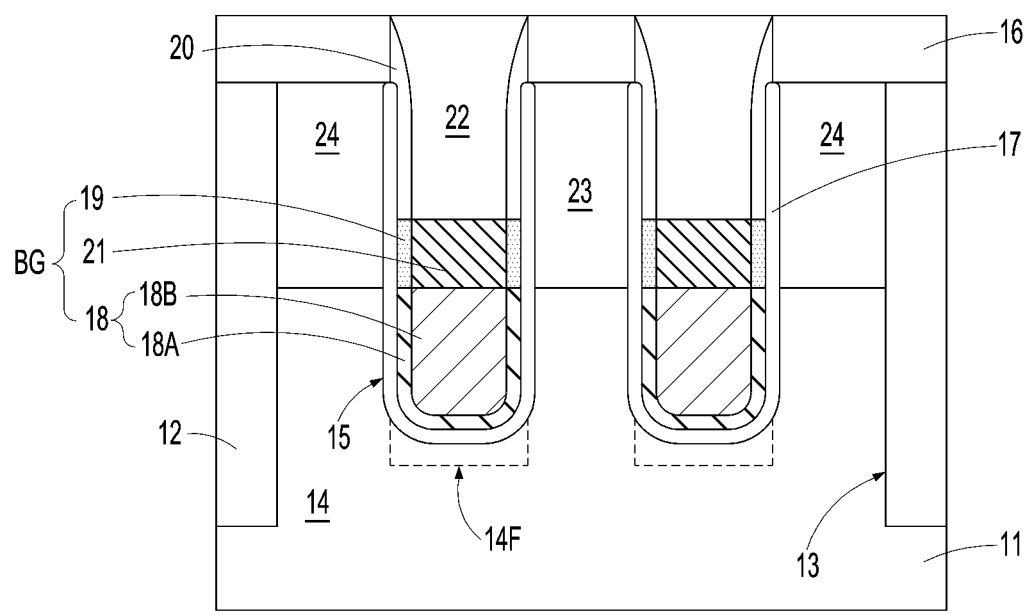

FIGS. 8A to 8C are cross-sectional views illustrating an example of a method for forming the semiconductor device 301 illustrated in FIG. 6B. The method illustrated in FIGS. 8A to 8C may be similar to the method illustrated in FIGS. 7A to 7G.

According to the processes illustrated in FIG. 7A to 7D, a spacer 20 and vertical gate 19 may be formed.

Subsequently, as illustrated in FIG. 8A, an upper gate layer 21' may be formed on a lower gate 18 and the spacer 20 to fill a trench 15. The upper gate layer 21' may be made of or include a low resistivity material. The upper gate layer 21' may be formed of the same material as the lower gate 18. The upper gate layer 21' and the lower gate 18 may be made of the same material. The upper gate layer 21' may be made of or include a metal-based material. The upper gate layer 21' may be made of or include a metal, metal nitride or a combination thereof. The upper gate layer 21' may be made of or include tungsten, tungsten nitride, titanium nitride or combinations thereof. In an embodiment, the upper gate layer 21' may be made of or include a low work function metal or low work function polysilicon.

As illustrated in FIG. 8B, a recessing process may be performed on the upper gate layer 21' to form an upper gate 21. The recessing process on the upper gate layer 21' may be performed by a dry etch process, for example, an etch-back process. In an embodiment, a planarization process may be performed first to expose the top surface of hard mask layer 16, and then the etch-back process of the recessing process may be performed on the upper gate layer 21'. The top surface of the upper gate 21 may be located at a lower level than the top surface of the active region 14. The upper gate 21 may fill the space between the inner sidewalls of the vertical gate 19. The top surface of the upper gate 21 may be located at the same level as the top surface of the vertical gate 19.

The lower gate 18, the vertical gate 19 and the upper gate 21 form gate electrode BG.

As illustrated in FIG. 8C, a capping layer 22 may be formed on the upper gate 21. The capping layer 22 may be made of or include a dielectric material. The capping layer 22 may include silicon nitride. The capping layer 22 may have an oxide-nitride-oxide (ONO) structure. The bottom surface of the capping layer 22 may contact the upper gate 21 and the vertical gate 19. Both sidewalls of the capping layer 22 may contact the spacer layer 20.

According to the processes described above, a buried gate structure may be formed. The buried gate structure may include the gate dielectric layer 17, the gate electrode BG, the spacer 20 and the capping layer 22. The gate electrode BG may include the lower gate 18, the vertical gate 19 and the upper gate 21. The top surfaces of the upper gate 21 and the vertical gate 19 are located at a lower level than the top surface of the active region 14.

After the capping layer 22 may be formed, an impurity doping process is performed through an implanting process or other doping techniques. Accordingly, first and second doped regions 23 and 24 are formed in a substrate 11. Each of the first and second doped regions 23 and 24 may have a depth laterally overlapping the upper gate 21 and the vertical gate 19. The lower gate 18 may not laterally overlap the first and second doped regions 23 and 24. The first and second doped regions 23 and 24 may be referred to as first and second source/drain regions, respectively.

Figure 9A:
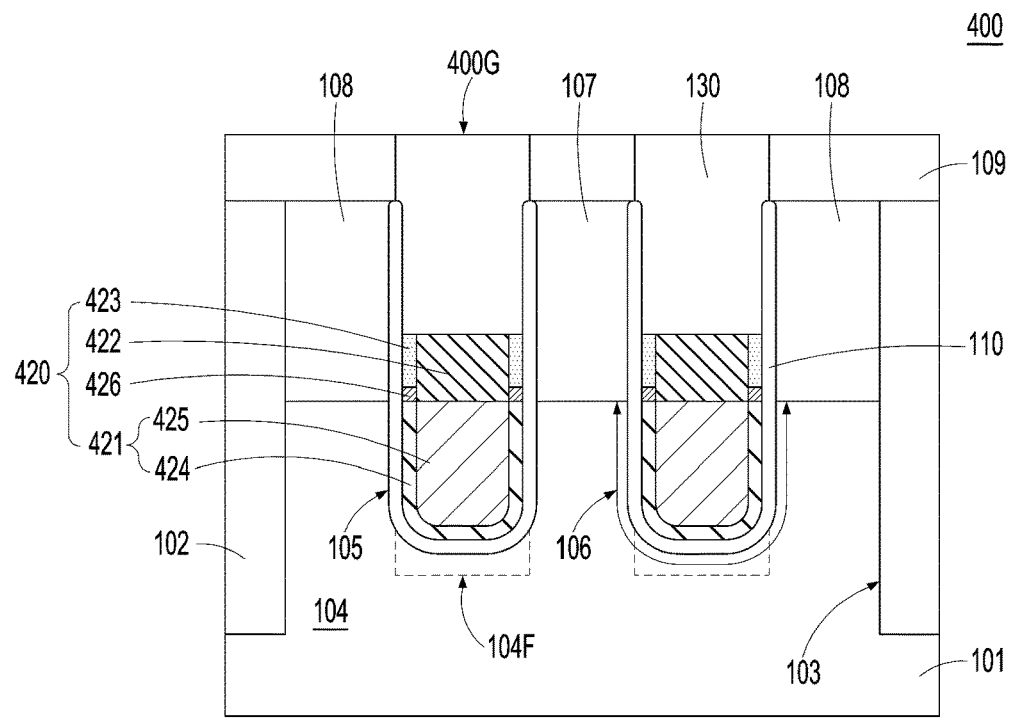
FIGS. 9A, 9B, 10A, 10B, 11A and 11B are cross-sectional views illustrating semiconductor devices in accordance with embodiments of the present invention.
Figure 9B:
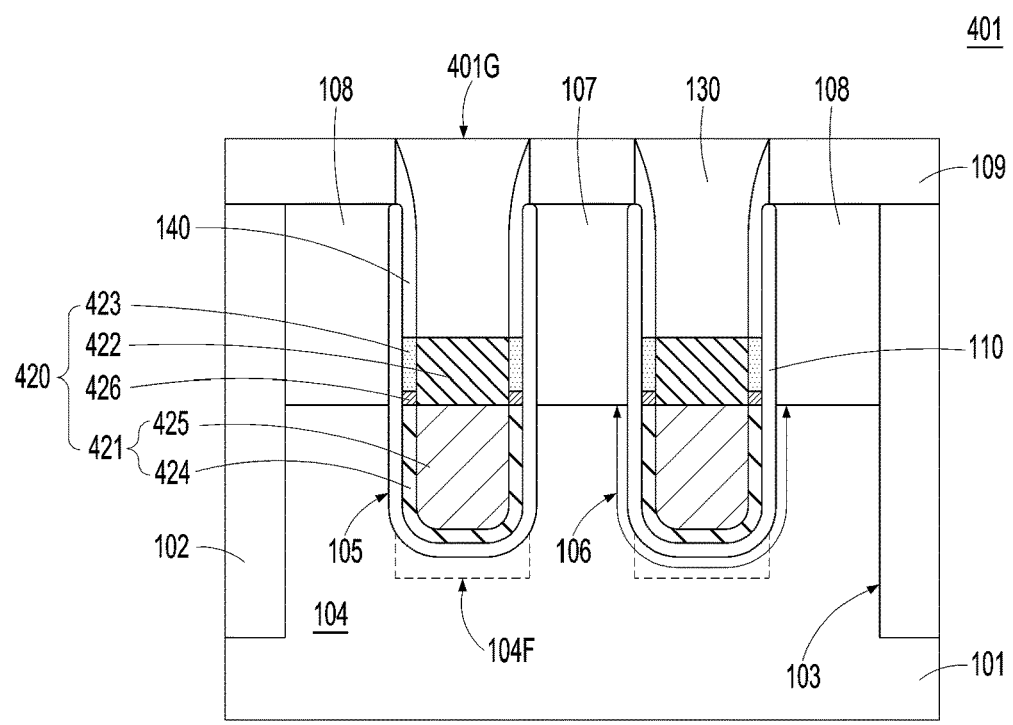

FIGS. 9A and 9B are cross-sectional views illustrating semiconductor devices 400 and 401 in accordance with embodiments of the present invention. The various features of the semiconductor devices 400 and 401 illustrated in FIGS. 9A and 9B may be similar to those of the semiconductor device 100 illustrated in FIG. 2A and the semiconductor device 300 illustrated in FIG. 6A, except for buried gate structures 400G and 401G. Hereinafter, in the present embodiment, detailed descriptions of various features overlapping those of the semiconductor devices 100 and 300 may be omitted.

Referring to FIG. 9A, the semiconductor device 400 may include the buried gate structure 400G.

The buried gate structure 400G may include gate dielectric layer 110 covering the bottom surface and sidewalls of trench 105, a gate electrode 420 and capping layer 130. The gate electrode 420 and the capping layer 130 are sequentially stacked on the gate dielectric layer 110 to fill the trench 105. The gate electrode 420 may be made of or include a lower gate 421, an upper gate 422 and vertical gate 423. The lower gate 421 may include a first barrier layer 424 and a low resistivity gate electrode 425. Second barrier layers 426 may be formed between the vertical gate 423 and the first barrier layer 424.

The first barrier layer 424 and the low resistivity gate electrode 425 may correspond to the barrier layer 324 and the low resistivity gate electrode 325 of FIG. 6A, respectively. For example, the low resistivity gate electrode 425 may be formed of tungsten (W), and the first barrier layer 424 may be formed of titanium nitride (TiN). Accordingly, the lower gate 421 may include a TiN/W stack. The upper gate 422 may be made of or include tungsten, and the vertical gate 423 may be made of or include N-type polysilicon.

The second barrier layer 426 may be formed on the first barrier layer 424. The second barrier layer 426 may be formed between the first barrier layer 424 and the vertical gate 423, and also between the gate dielectric layer 110 and the upper gate 422. The first barrier layer 424 and the second barrier layer 426 may be made of the same material or different materials. The second barrier layer 426 may be made of or include metal nitride.

The second barrier layer 426 and the vertical gate 423 may have the same thickness. The thickness of the second barrier layer 426 may be modified in various manners according to the thickness of the vertical gate 423. The vertical gate 423, the first barrier layer 424 and the second barrier layer 426 may have the same thickness.

As may be described later, the second barrier layer 426 may be formed by plasma nitridation. For example, the second barrier layer 426 may be formed by exposing the top surfaces of the low resistivity gate electrode 425 and the first barrier layer 424 to the plasma nitridation.

The various features of the semiconductor device 401 illustrated in FIG. 9B may be similar to those of the semiconductor device 400 illustrated in FIG. 9A, except for the buried gate structure 401G. Hereinafter, in the present embodiment, detailed descriptions of various features overlapping those of the semiconductor device 400 may be omitted.

As illustrated in FIG. 9B, the buried gate structure 401G may include gate dielectric layer 110 covering the bottom surface and sidewalls of trench 105, and a gate electrode 420 and capping layer 130 which are sequentially stacked to fill the trench 105 on the gate dielectric layer 110. The gate electrode 420 may be made of or include a lower gate 421, an upper gate 422 and vertical gate 423. The lower gate 421 may include a first barrier layer 424 and a low resistivity gate electrode 425. A second barrier layer 426 may be formed between the vertical gate 423 and the first barrier layer 424. The buried gate structure 401G may further include spacer vertically extended on the vertical gate 423.

Figure 10A:
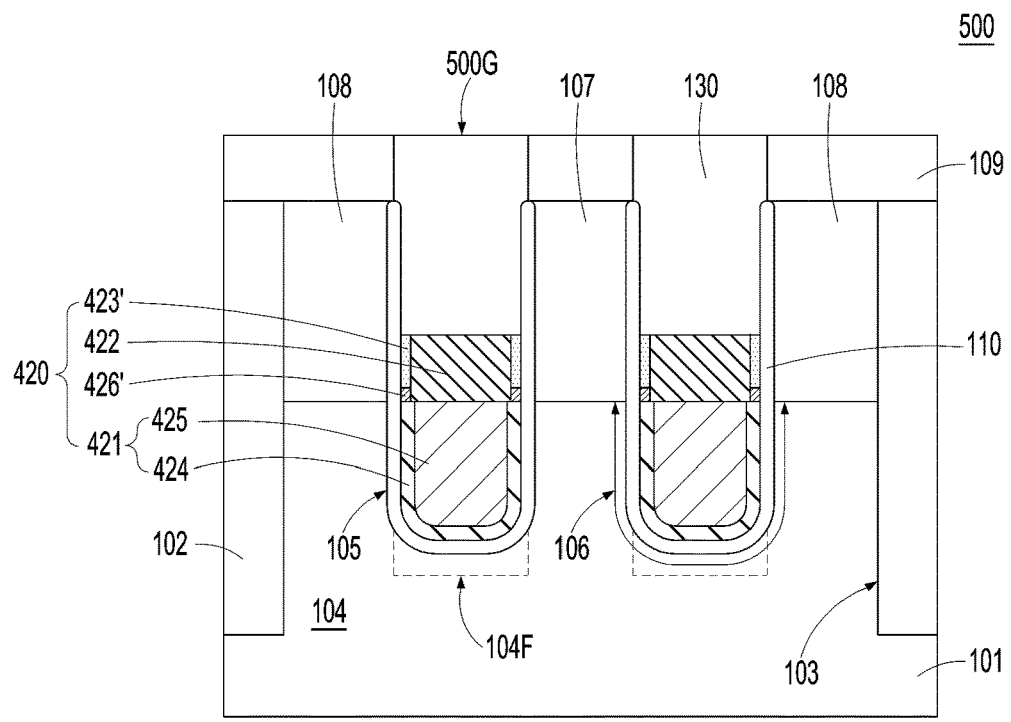
Figure 10B:
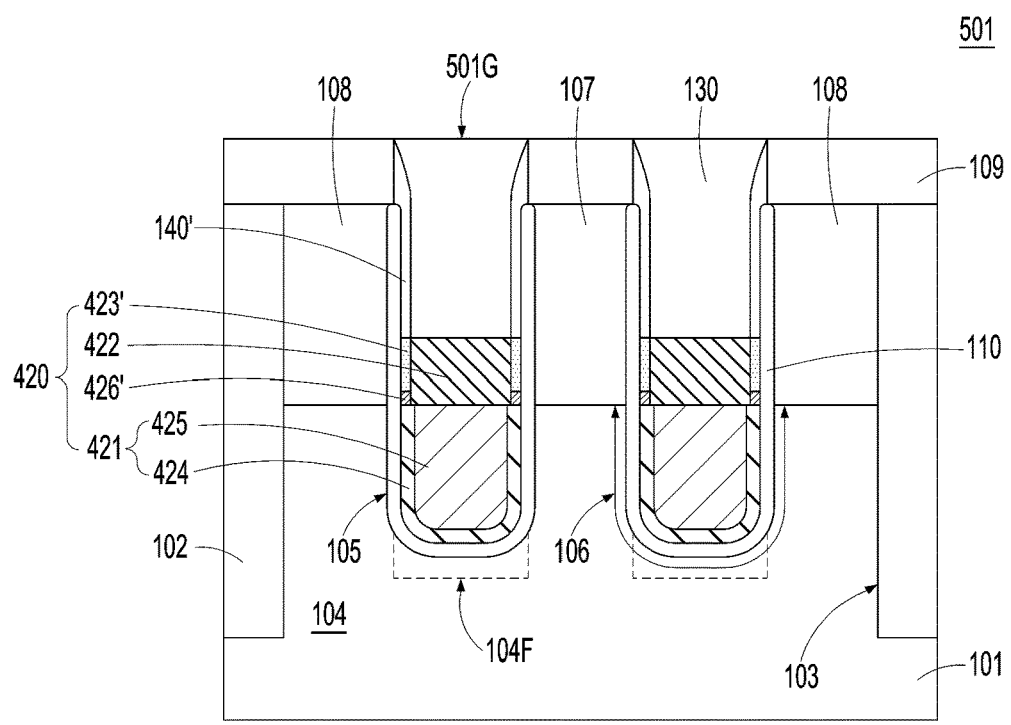

FIGS. 10A and 10B are cross-sectional views illustrating semiconductor devices 500 and 501 in accordance with embodiments of the present invention. The various features of the semiconductor devices 500 and 501 illustrated in FIGS. 10A and 10B may be similar to those of the semiconductor device 400 illustrated in FIG. 9A and the semiconductor device 401 illustrated in FIG. 9B, except for buried gate structures 500G and 501G. Hereinafter, in the present embodiment, detailed descriptions of various features overlapping those of the semiconductor devices 400 and 401 may be omitted.

Referring to FIG. 10A, the semiconductor device 500 may include the buried gate structure 500G.

The buried gate structure 500G may include gate dielectric layer 110 covering the bottom surface and sidewalls of trench 105, a gate electrode 420 and capping layer 130. The gate electrode 420 and the capping layer 130 are sequentially stacked on the gate dielectric layer 110 to fill the trench 105. The gate electrode 420 may be made of or include a lower gate 421, an upper gate 422 and vertical gate 423'. The lower gate 421 may include a first barrier layer 424 and a low resistivity gate electrode 425. Second barrier layer 426' may be formed between the vertical gate 423' and the first barrier layer 424. The low resistivity gate electrode 425 may be formed of tungsten (W), and the first barrier layer 424 may be formed of titanium nitride (TiN). Accordingly, the lower gate 421 may include a TiN/W stack. The upper gate 422 may be made of or include tungsten, and the vertical gate 423' may be made of or include N-type polysilicon.

The second barrier layer 426' may be formed on the first barrier layer 424. The second barrier layer 426' may be formed between the first barrier layer 424 and the vertical gate 423', and be formed between the gate dielectric layer 110 and the upper gate 422. The first barrier layer 424 and the second barrier layer 426' may be the same material or different materials. The second barrier layer 426' may be made of or include metal nitride.

The second barrier layer 426' and the vertical gate 423' may have the same thickness. The thickness of the second barrier layer 426' may be modified in various manners according to the thickness of the vertical gate 423'. The vertical gate 423' and the second barrier layer 426' may have smaller thicknesses than the first barrier layer 424. The upper gate 422 may have a larger width than the low resistivity gate electrode 425.

The second barrier layer 426' may be formed by plasma nitridation. For example, the second barrier layer 426' may be formed by exposing the top surfaces of the low resistivity gate electrode 425 and the first barrier layer 424 to the plasma nitridation.

The various features of the semiconductor device 501 illustrated in FIG. 10B may be similar to those of the semiconductor device 500 illustrated in FIG. 10A, except for the buried gate structure 501G. Hereinafter, in the present embodiment, detailed descriptions of various features overlapping those of the semiconductor device 500 may be omitted.

As illustrated in FIG. 10B, the buried gate structure 501G may include gate dielectric layer 110 covering the bottom surface and sidewalls of trench 105, and a gate electrode 420 and capping layer 130 which are sequentially stacked to fill the trench 105 on the gate dielectric layer 110. The gate electrode 420 may be made of or include a lower gate 421, an upper gate 422 and vertical gate 423'. The lower gate 421 may include a first barrier layer 424 and a low resistivity gate electrode 425. A second barrier layer 426' may be formed between the vertical gate 423' and the first barrier layer 424. The buried gate structure 501G may further include spacer 140' vertically extended on the vertical gate 423'.

Figure 11A:
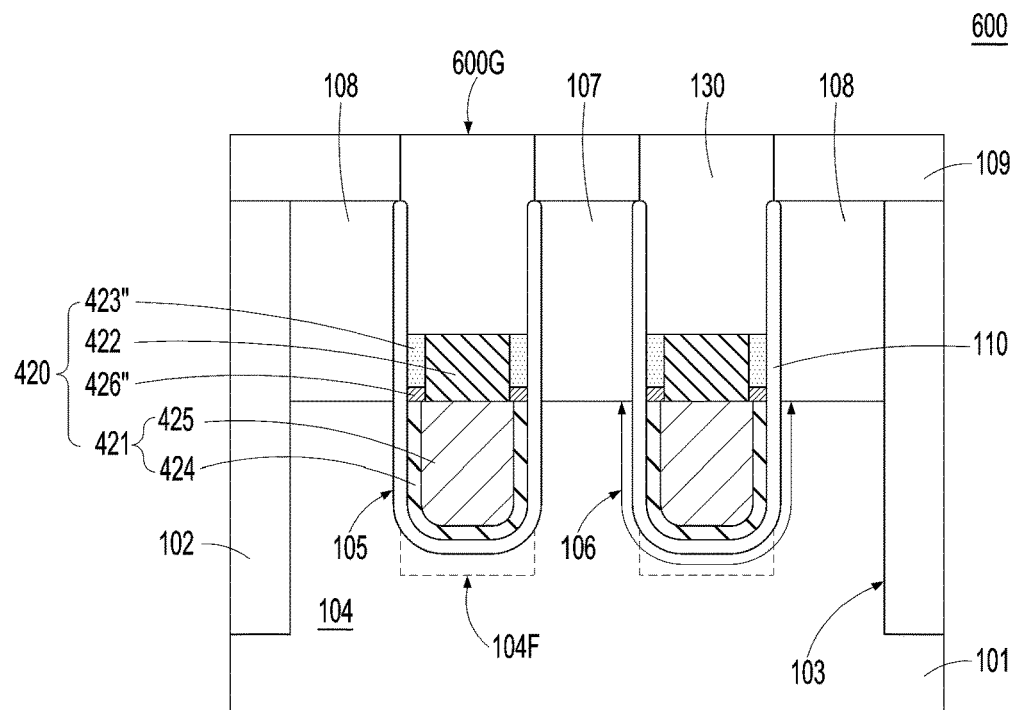
Figure 11B:
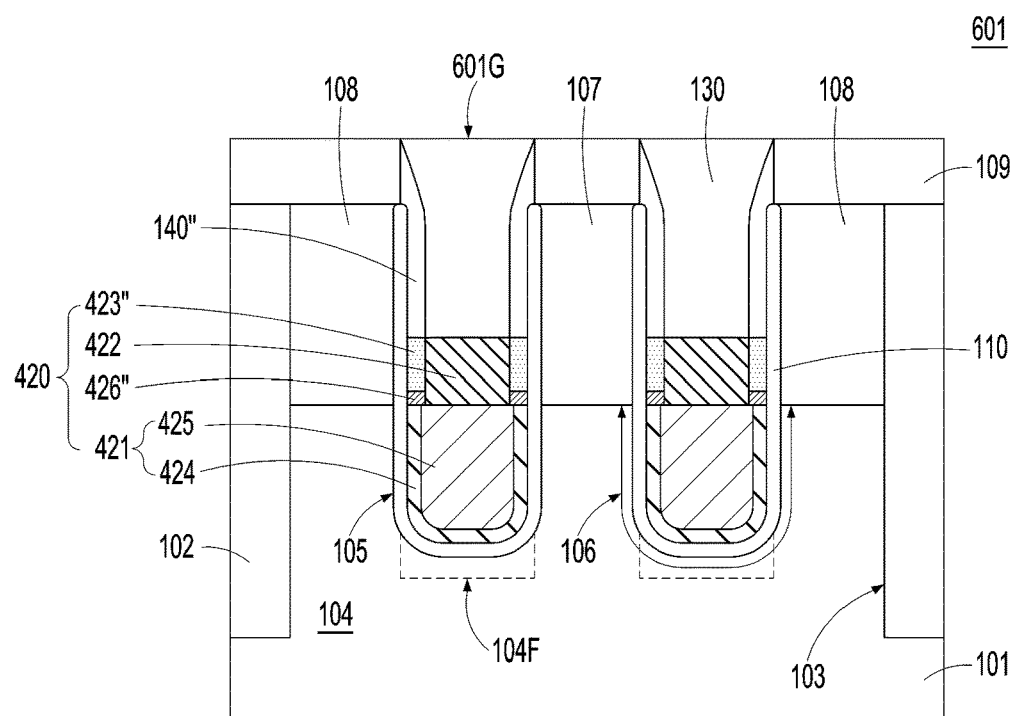

FIGS. 11A and 11B are cross-sectional views illustrating semiconductor devices 600 and 601 in accordance with embodiments of the present invention. The various features of the semiconductor devices 600 and 601 illustrated in FIGS. 11A and 11B may be similar to those of the semiconductor device 400 illustrated in FIG. 9A and the semiconductor device 401 illustrated in FIG. 9B, except for buried gate structures 600G and 601G. Hereinafter, in the present embodiment, detailed descriptions of various features overlapping those of the semiconductor devices 400 and 401 may be omitted.

Referring to FIG. 11A, the semiconductor device 600 may include the buried gate structure 600G.

The buried gate structure 600G may include gate dielectric layer 110 covering the bottom surface and sidewalls of trench 105, and a gate electrode 420 and capping layer 130 which are sequentially stacked to fill the trench 105 on the gate dielectric layer 110. The gate electrode 420 may be made of or include a lower gate 421, an upper gate 422 and vertical gate 423". The lower gate 421 may include a first barrier layer 424 and a low resistivity gate electrode 425. Second barrier layer 426" may be formed between the vertical gate 423" and the first barrier layer 424. The low resistivity gate electrode 425 may be formed of tungsten (W), and the first barrier layer 424 may be formed of titanium nitride (TiN). Accordingly, the lower gate 421 may include a TiN/W stack. The upper gate 422 may be made of or include tungsten, and the vertical gate 423" may be made of or include N-type polysilicon.

The second barrier layer 426" may be formed on the first barrier layer 424. The second barrier layer 426" may be formed between the first barrier layer 424 and the vertical gate 423". The first barrier layer 424 and the second barrier layer 426" may be the same material or different materials. The second barrier layer 426" may be made of or include metal nitride.

The second barrier layer 426" and the vertical gate 423" may have the same thickness. The thickness of the second barrier layer 426" may be modified in various manners according to the thickness of the vertical gate 423". The vertical gate 423" and the second barrier layer 426" may have larger thicknesses than the first barrier layer 424. The upper gate 422 may have a smaller width than the low resistivity gate electrode 425.

The second barrier layer 426" may be formed by plasma nitridation. For example, the second barrier layer 426" may be formed by exposing the top surfaces of the low resistivity gate electrode 425 and the first barrier layer 424 to the plasma nitridation.

The various features of the semiconductor device 601 illustrated in FIG. 11B may be similar to those of the semiconductor device 600 illustrated in FIG. 11A, except for the buried gate structure 601G. Hereinafter, in the present embodiment, detailed descriptions of various features overlapping those of the semiconductor device 600 may be omitted.

As illustrated in FIG. 11B, the buried gate structure 601G may include gate dielectric layer 110 covering the bottom surface and sidewalls of trench 105, a gate electrode 420 and capping layer 130 which are sequentially stacked to fill the trench 105 on the gate dielectric layer 110. The gate electrode 420 may be made of or include a lower gate 421, an upper gate 422 and vertical gate 423". The lower gate 421 may include a first barrier layer 424 and a low resistivity gate electrode 425. Second barrier layer 426" may be formed between the vertical gate 423" and the first barrier layer 424. The buried gate structure 601G may further include spacer 140" vertically extended on the vertical gate 423".

As illustrated in FIGS. 9A, 9B, 10A, 10B, 11A and 11B, the second barrier layers 426, 426' and 426" may be formed over the first barrier layer 424. When the first barrier layer 424 includes titanium nitride, the second barrier layers 426, 426' and 426" may include nitrogen-rich titanium nitride.

Referring back to FIG. 11B, a part of the second barrier layer 426" may contact the upper edges of the low resistivity gate electrode 425. Accordingly, a part of the second barrier layer 426" may include a portion formed by exposing the top surface of the low resistivity gate electrode 425 to plasma nitridation. When the low resistivity gate electrode 425 includes tungsten, a part of the second barrier layer 426" may be made of or include tungsten nitride. Consequently, the second barrier layer 426" may include a compound of nitrogen-rich titanium nitride and tungsten nitride.

In an embodiment, the second barrier layers 426, 426' and 426" may be formed by plasma oxidation.

FIGS. 12A to 12F are cross-sectional views illustrating an example of a method for forming the semiconductor device 400 illustrated in FIG. 9A. The method illustrated in FIGS. 12A to 12F may be similar to the method illustrated in FIGS. 7A to 7G.

By the method illustrated in FIGS. 7A to 7D, a lower gate 18 including a first barrier layer 18A and a low resistivity metal layer 18B may be formed.

Figure 12A:
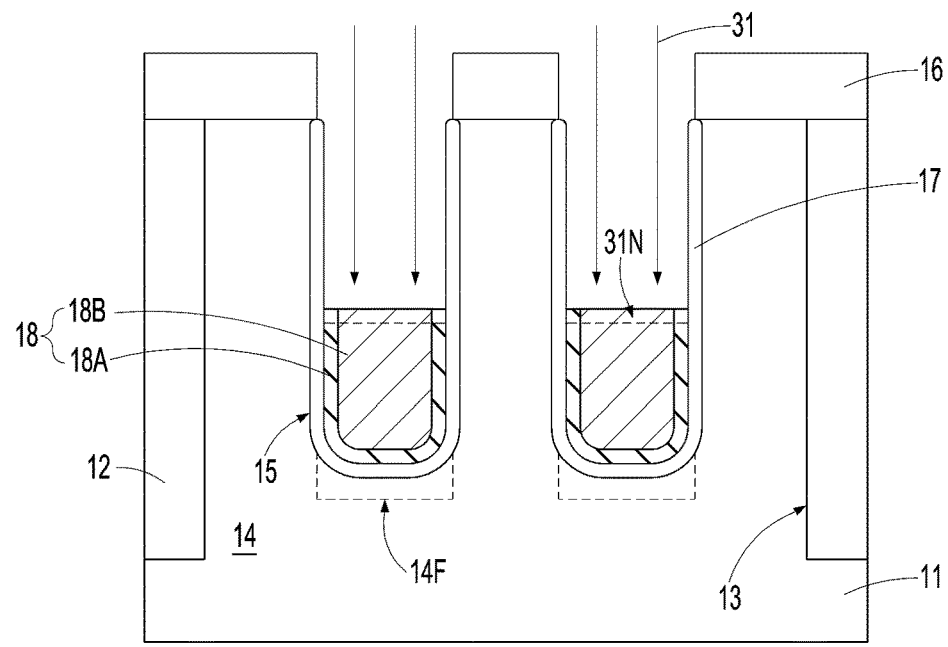
FIGS. 12A to 12F are cross-sectional views illustrating an example of a method for forming the semiconductor device illustrated in FIG. 9A.

Subsequently, as illustrated in FIG. 12A, a plasma treatment 31 may be performed. The plasma treatment 31 may be performed in an atmosphere of a nitrogen-containing gas or an oxygen-containing gas. The plasma treatment 31 may include plasma nitridation or plasma oxidation.

A top surface 31N of the lower gate 18 may be modified by the plasma treatment 31. For example, the top surface 31N of the lower gate 18 may be nitrided by plasma nitridation.

Figure 12B:
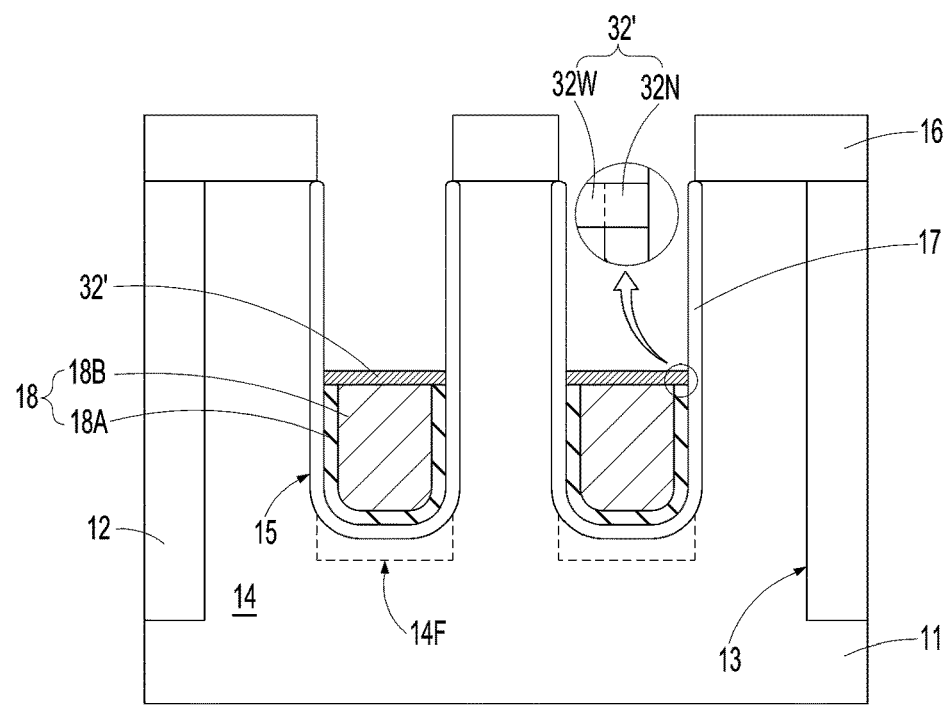

After the plasma treatment 31 is performed, as illustrated in FIG. 12B, a second barrier layer 32' may be formed. The second barrier layer 32' may be a nitrided top surface of the lower gate 18. The second barrier layer 32' may be a surface nitride of the lower gate 18. When the low resistivity metal layer 18B includes tungsten, a part of the second barrier layer 32' may be made of or include tungsten nitride 32W. When a first barrier layer 18A includes titanium nitride, another part of the second barrier layer 32' may include nitrogen-rich titanium nitride 32N.

As described above, the second barrier layer 32' may be selectively formed only on the top surface of the lower gate 18.

Figure 12C:
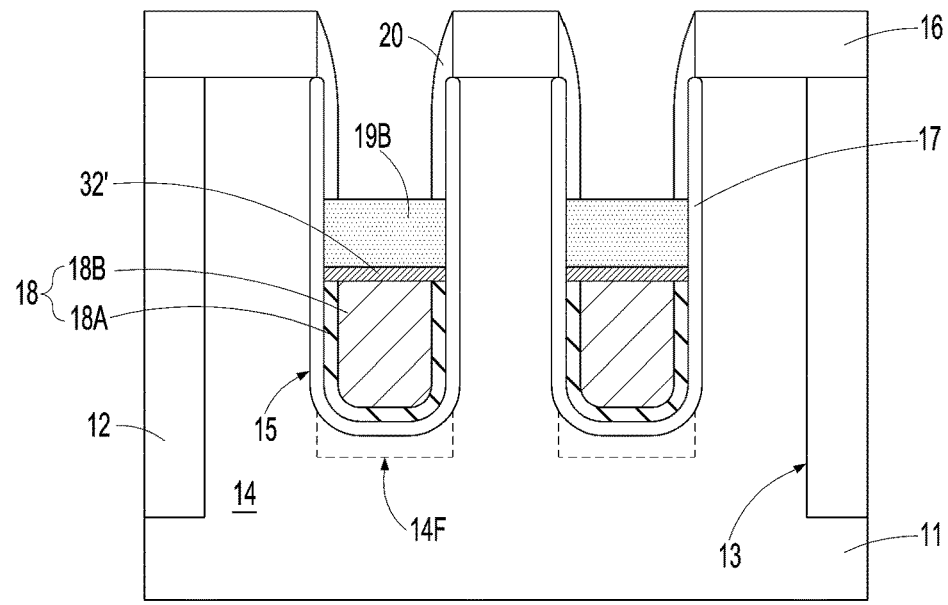

As illustrated in FIG. 12C, a work function layer 19B may be formed on the second barrier layer 32'. In order to form the work function layer 19B, a low work function material (not illustrated) may be deposited to fill a trench 15 on the second barrier layer 32', and then a recessing process may be performed on the low work function material. The low work function material may be formed by CVD or ALD. The recessing process on the low work function material may be performed by a dry etch process, for example, an etch-back process. The work function layer 19B may be formed by performing the etch-back process on the low work function material. In an embodiment, a planarization process may be performed first to expose the top surface of hard mask layer 16, and then the etch-back process of the recessing process may be performed on the low work function material. The top surface of the work function layer 19B may be located at a lower level than the top surface of an active region 14.

The work function layer 19B may have a work function lower than the mid-gap work function of silicon. The work function layer 19B may be made of or include a low work function metal or low work function polysilicon. The low work function polysilicon may be made of or include N-type polysilicon. The low work function metal may be made of or include titanium-rich titanium nitride (TiN). In the present embodiment, the work function layer 19B may be polysilicon doped with an N-type impurity.

After the work function layer 19B is formed, a part of the surface of a gate dielectric layer 17 may be exposed. The work function layer 19B may have a shape of partially filling the trench 15 on the second barrier layer 32'. The second barrier layer 32' may prevent mutual diffusion between the lower gate 18 and the work function layer 19B.

Spacer 20 may be formed. A deposition process and an etch-back process may be performed on a spacer layer to form the spacer 20. The spacer 20 may cover an exposed part of the gate dielectric layer 17, and the bottom surface of the spacer 20 may contact the edge-side top surfaces of the work function layer 19B. Most of the top surface of the work function layer 19B may be exposed by the spacer 20. A part of the spacer 20 may cover the exposed part of the gate dielectric layer 17 and the surface of the hard mask layer 16.

Figure 12D:
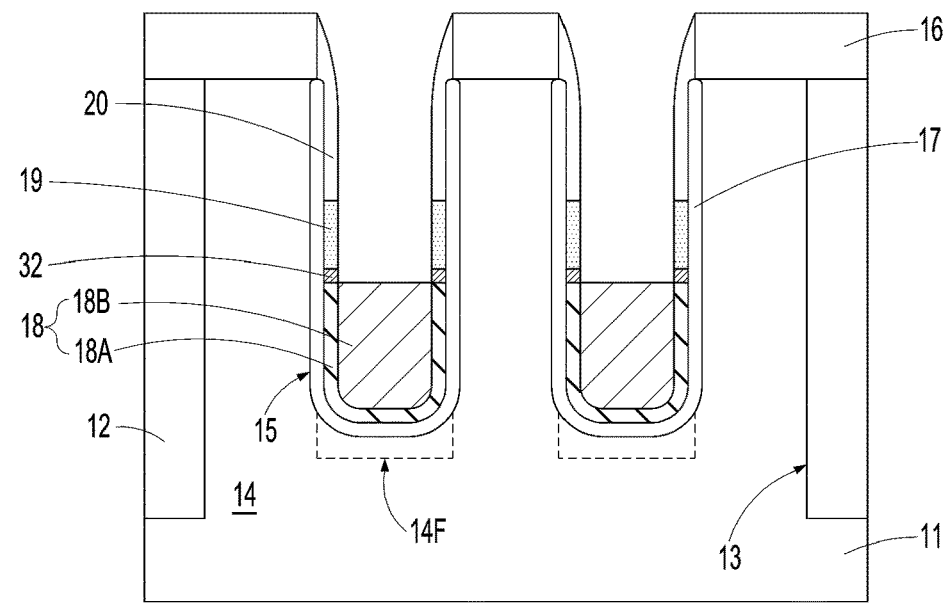

As illustrated in FIG. 12D, vertical gate 19 may be formed. The vertical gate 19 may be formed by etching the work function layer 19B. The vertical gate 19 may be formed by performing a self-aligned etch process on the work function layer 19B using the spacer 20 as an etch mask. The vertical gate 19 may partially cover the exposed part of the gate dielectric layer 17. The vertical gate 19 may be located above both edges of the lower gate 18.

As described above, since the vertical gate 19 are formed by the self-aligned etch process using the spacer 20, the width and height of the vertical gate 19 may be uniformly formed.

Subsequently, the second barrier layer 32' may be etched to expose the top surface of the lower gate 18. The second barrier layer 32' may be self-aligned and etched on the sidewalls of the vertical gate 19. The second barrier layers 32 may remain directly below the vertical gate 19. The second barrier layers 32 may be located between the first barrier layer 18A and the vertical gate 19. The first barrier layer 18A, the second barrier layer 32 and the vertical gate 19 may have the same thickness. In an embodiment, the second barrier layer 32 may have a smaller or larger thickness than the first barrier layer 18A. A change in the thickness of the second barrier layer 32 may be obtained by adjusting the thickness of the spacer 20.

Figure 12E:
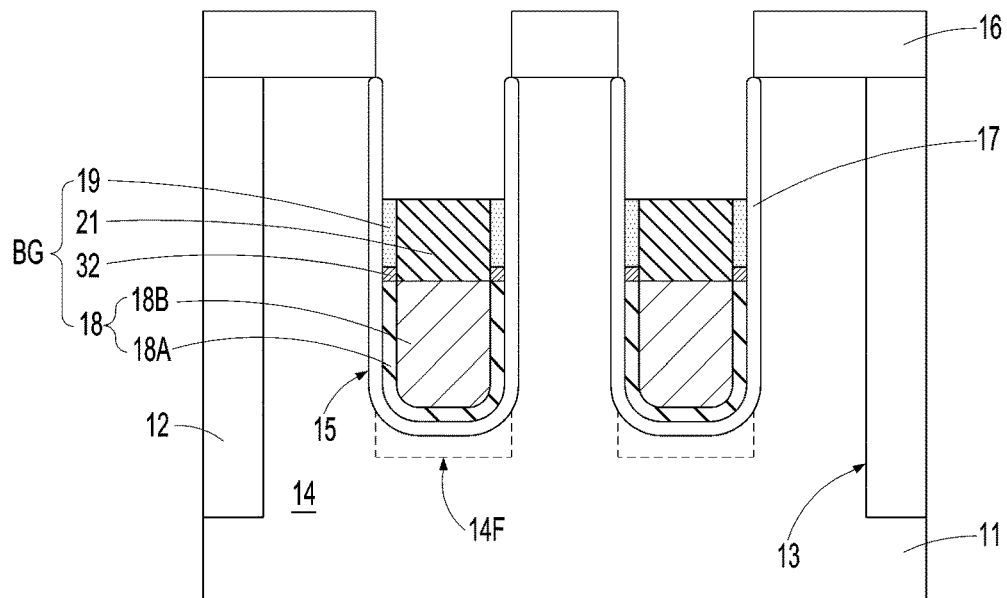

As illustrated in FIG. 12E, after the spacer 20 is removed, an upper gate 21 may be formed. In order to form the upper gate 21, a deposition process and a recessing process may be performed on an upper gate layer (not illustrated).

The top surface of the upper gate 21 may be located at a lower level than the top surface of the active region 14. The upper gate 21 may fill the space between the inner sidewalls of the vertical gate 19. The top surface of the upper gate 21 may be located at the same level as the top surface of the vertical gate 19.

The lower gate 18, the vertical gate 19 and the upper gate 21 form gate electrode BG. The gate electrode BG may further include the second barrier layers 32. When each of the lower and upper gates 18 and 21 are formed of a metal-based material, the volume of the metal-based material occupying the gate electrode BG may be increased. Accordingly, the resistance of the gate electrode BG may be decreased.

Figure 12F:
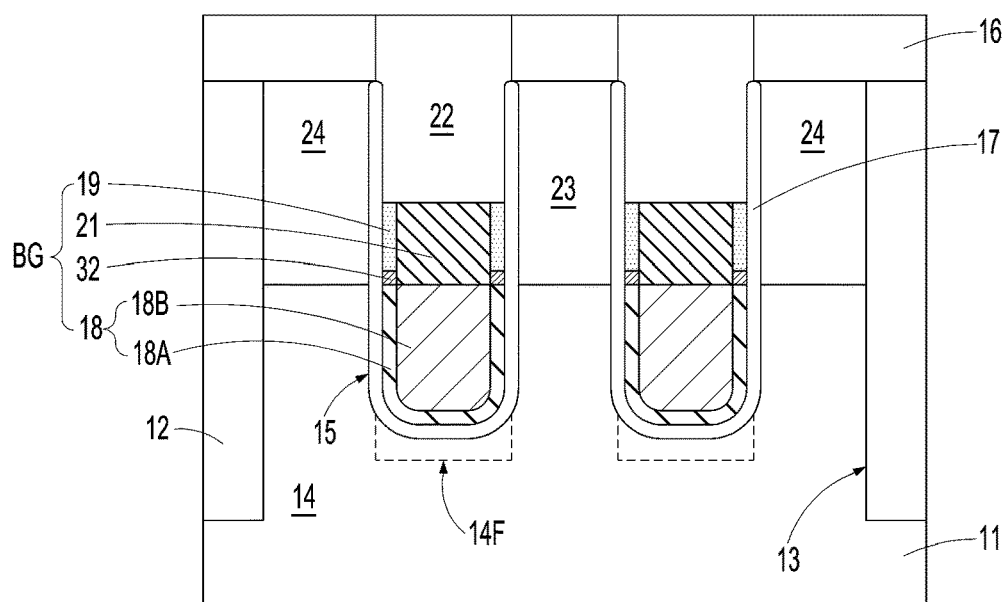

As illustrated in FIG. 12F, a capping layer 22 may be formed on the upper gate 21. The capping layer 22 may be made of or include a dielectric material. The capping layer 22 may include silicon nitride. The capping layer 22 may have an oxide-nitride-oxide (ONO) structure. Subsequently, the capping layer 22 may be planarized to expose the surface of the hard mask layer 16. The bottom surface of the capping layer 22 may contact the upper gate 21 and the vertical gate 19. Both sidewalls of the capping layer 22 may contact the gate dielectric layer 17 and the hard mask layer 16.

According to the processes described above, a buried gate structure may be formed. The buried gate structure may include the gate dielectric layer 17, the gate electrode BG and the capping layer 22. The gate electrode BG may include the lower gate 18, the vertical gate 19 and the upper gate 21. The top surfaces of the upper gate 21 and the vertical gate 19 are located at a lower level than the top surface of the active region 14. The upper gate 21 may fill the space between the inner sidewalls of the vertical gate 19. The top surface of the upper gate 21 may be located at the same level as the top surface of the vertical gate 19.

After the capping layer 22 may be formed, an impurity doping process may be performed by an implanting process or any other suitable doping technique. Accordingly, first and second doped regions 23 and 24 are formed in the substrate 11. Each of the first and second doped regions 23 and 24 may have a depth laterally overlapping the upper gate 21 and the vertical gate 19. The lower gate 18 may not laterally overlap the first and second doped regions 23 and 24. The first and second doped regions 23 and 24 may be referred to as first and second source/drain regions, respectively.

In an embodiment, the upper gate 21 may be formed in a subsequent process without removing the spacer 20. Accordingly, the semiconductor device 401 illustrated in FIG. 9B may be formed.

The semiconductor devices 500, 501, 600 and 601 illustrated in FIGS. 10A, 10B, 11A and 11B may be formed by the method illustrated in FIGS. 12A to 12F. For example, the semiconductor devices 500, 501, 600 and 601 may be formed by changing the thickness of the spacer 20 of FIG. 12C in various manners. The semiconductor devices 500 and 501 of FIGS. 10A and 10B may be formed by forming the spacer 20 to have a small thickness. In addition, the semiconductor devices 600 and 601 of FIGS. 11A and 11B may be formed by forming the spacer 20 to have a larger thickness.

Figure 13:
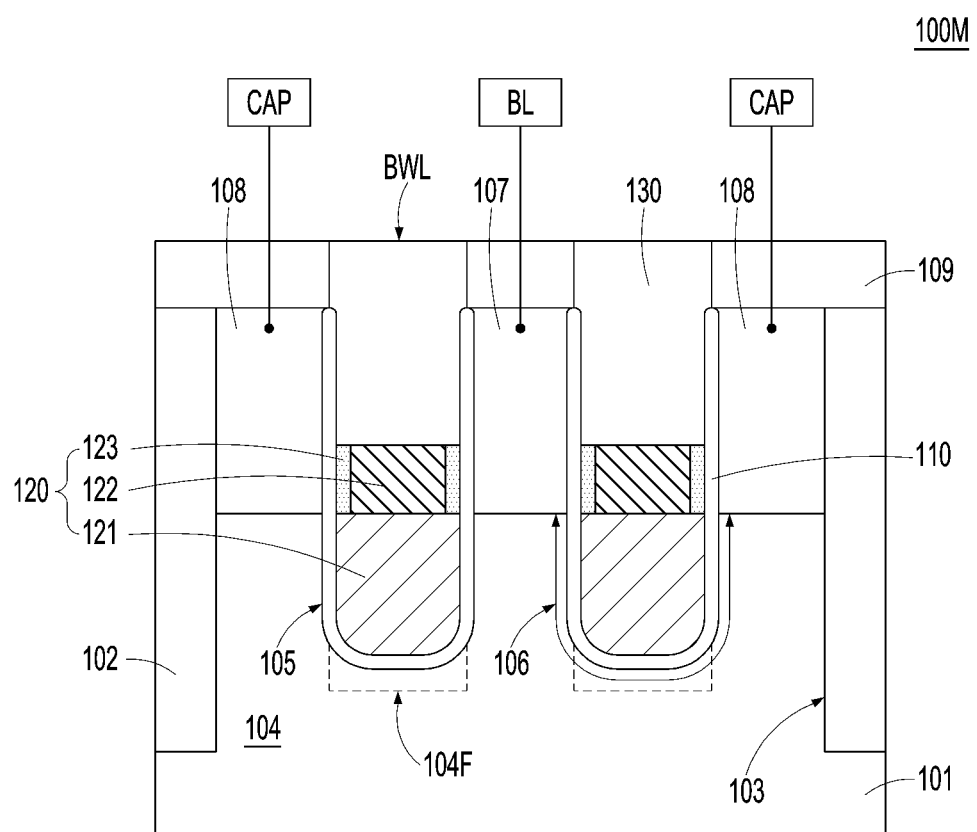
FIG. 13 is a cross-sectional view illustrating a memory cell.

FIG. 13 is a cross-sectional view illustrating a memory cell 100M.

Referring to FIG. 13, the memory cell 100M may include a cell transistor, a bit line BL and a capacitor CAP. The cell transistor may include the semiconductor device 100 of FIG. 2A. Accordingly, the cell transistor may include a buried gate structure BWL, a channel 106, and first and second doped regions 107, 108. The first doped region 107 may be electrically connected to the bit line BL. The second doped region 108 may be electrically connected to the capacitor CAP.

In the memory cell 100M, the buried gate structure BWL may be referred to as a buried word line structure BWL. The buried word line structure BWL may be embedded in trench 105. The buried word line structure BWL may include gate dielectric layer 110, a gate electrode 120 and capping layer 130. The gate electrode 120 may be made of or include a lower gate 121, an upper gate 122 and vertical gate 123.

The buried word line structure BWL may be replaced with any one of the buried gate structures 100G, 200G, 300G, 301G, 400G, 401G, 500G, 501G, 600G and 601G in accordance with the above-described embodiments.

The capacitor CAP may include a storage node, a dielectric layer and a plate node. The storage node may have a cylindrical shape or a pillar shape. The dielectric layer may be formed on the surface of the storage node. The dielectric layer may be or include at least one selected from zirconium oxide, aluminum oxide and hafnium oxide. For example, the dielectric layer may have a ZAZ ($ZrO_2/Al_2O_3/ZrO_2$) structure where first zirconium oxide, aluminum oxide and second zirconium oxide are stacked. The plate node is formed on the dielectric layer. The storage node and the plate node may be made of or include a metal-containing material.

The memory cell 100M may be a part of a Dynamic Random-Access Memory (DRAM). When the memory cell 100M is applied to the DRAM, the refresh characteristics of the DRAM may be improved. Also, it is possible to prevent off-leakage, which leads to improved retention time.

According to embodiments, a low work function vertical gate is formed, thereby further decreasing a GIDL.

Also, according to embodiments, since vertical gate is formed by a self-aligned etch process using a spacer, the width and height of the vertical gate may be uniformly formed.

While the present invention has been described with respect to specific embodiments, it should be noted that the embodiments are for describing, not limiting, the present invention. Further, it should be noted that the present invention may be achieved in various ways through substitution, change, and modification, by those skilled in the art without departing from the scope of the present invention as defined by the following claims.

What is claimed is:

1. A semiconductor device, comprising:
   a gate dielectric layer conformally covering a trench of a substrate;
   a lower gate formed over the gate dielectric layer and partially filling a lower portion of the trench;
   a vertical gate formed on both upper edges of the lower gate;
   an upper gate filled in inner space of the vertical gate;
   a capping layer formed over the upper gate;
   a spacer formed over the vertical gate and formed between the gate dielectric layer and the capping layer; and
   a barrier layer between the vertical gate and the lower gate,
   wherein the barrier layer includes material that nitrides a surface of the lower gate.

2. The device of claim 1, wherein the vertical gate is self-aligned with the spacer.

3. The device of claim 1, wherein the spacer is formed of a material having an etch selectivity with respect to the vertical gate.

4. The device of claim 1, wherein the spacer is formed of silicon oxide.

5. The device of claim 1, wherein the vertical gate is formed of low work function material than the lower gate.

6. The device of claim 1, wherein the vertical gate is formed of N-type polysilicon, and the lower gate and the upper gate are formed of metal-base material.

7. The device of claim 1, the lower gate includes titanium nitride, and the barrier layer includes nitrogen-rich titanium nitride.

* * * * *